United States Patent
Feiweier

(10) Patent No.: US 8,497,681 B2
(45) Date of Patent: Jul. 30, 2013

(54) MAGNETIC RESONANCE METHOD AND APPARATUS TO DETERMINE PHASE CORRECTION PARAMETERS

(75) Inventor: Thorsten Feiweier, Poxdorf (DE)

(73) Assignee: Siemens Aktiengesellschaft, Munich (DE)

( * ) Notice: Subject to any disclaimer, the term of this patent is extended or adjusted under 35 U.S.C. 154(b) by 311 days.

(21) Appl. No.: 13/071,778

(22) Filed: Mar. 25, 2011

(65) Prior Publication Data
US 2011/0234221 A1 Sep. 29, 2011

(30) Foreign Application Priority Data

Mar. 26, 2010 (DE) .................. 10 2010 012 948

(51) Int. Cl.
*G01V 3/00* (2006.01)
(52) U.S. Cl.
USPC ......................................... 324/309; 324/318
(58) Field of Classification Search
USPC .................. 324/300–322; 600/407–445
See application file for complete search history.

(56) References Cited

U.S. PATENT DOCUMENTS

| | | | |
|---|---|---|---|
| 5,923,168 A | 7/1999 | Zhou et al. | |
| 6,043,651 A | 3/2000 | Heid | |
| 7,099,499 B2 * | 8/2006 | Blezek et al. | 382/128 |
| 7,259,557 B2 | 8/2007 | Hinks et al. | |
| 7,492,155 B2 | 2/2009 | He et al. | |
| 7,786,728 B2 * | 8/2010 | Fukuta | 324/307 |
| 2007/0055137 A1 | 3/2007 | Feiweier | |
| 2012/0074940 A1 * | 3/2012 | Kimura | 324/314 |

* cited by examiner

*Primary Examiner* — Brij Shrivastav
(74) *Attorney, Agent, or Firm* — Schiff Hardin LLP

(57) ABSTRACT

In a magnetic resonance system and operating method to determine phase correction parameters for a phase correction in MR image data, first and second phase correction data sets are thereby acquired and correlations are calculated between data of the second phase correction data set and data of the first phase correction data set. Phase correction parameters are determined, such as coefficients of a power series that approximates a curve of a phase difference between phase curves of the second and first phase correction data sets.

19 Claims, 13 Drawing Sheets

MAGNETIC RESONANCE METHOD AND APPARATUS TO DETERMINE PHASE CORRECTION PARAMETERS

BACKGROUND OF THE INVENTION

1. Field of the Invention

The present invention concerns a method and apparatus to determine phase correction parameters for magnetic resonance (MR) data. The invention in particular concerns such a method and such a device that are designed to implement a phase correction of MR data that have multiple segments with different phase curve.

2. Description of the Prior Art

The acquisition of MR data often takes place with multiple data sets being acquired and assembled into a complete data set. Such a segmented acquisition of MR data can, for example, take place with a pulse sequence in which various segments of k-space are read out in different gradient echoes or spin echoes and are assembled into complete k-space. Examples of such methods are turbo spin echo (TSE) imaging in which multiple spin echoes that respectively depict different lines of k-space are generated after radiation of a radio-frequency (RF) pulse by the radiation of multiple refocusing pulses, and echoplanar imaging (EPI) in which multiple pairs of gradient echoes are generated so that k-space is scanned by alternation of the readout gradient.

Magnetic field inhomogeneities, eddy current effects, slight time shifts or the like can lead to the situation that the different data sets have a respective evolution of the background phase that is characteristic of them. The background phases for the different data sets can be different per pairs. In the event that the data sets are assembled into a complete data set without additional correction, the MR image data can have artifacts. For example, the alternation of the polarity of the readout gradient in EPI requires that the read-out data are inserted into a raw data matrix such that the order in which the data are inserted into the raw data matrix changes from line to line. A slight time shift in the data acquisition between different gradient echoes can also lead to characteristic phase shifts between the background phase curves of data read out from even echoes (for example the second, fourth etc. echo of a sequence of echo signals) and odd echoes (for example the first, third etc. echo of a sequence of echo signals). For example, in positional space this is manifested by ghosting artifacts that are designated as Nyquist ghosts or N/2 ghosts. In TSE imaging each spin echo can have a characteristic phase error, for example due to dynamic interference fields that develop in the course of an echo train. These can likewise lead to ghosting artifacts in positional space.

To reduce such artifacts, a phase correction can be conducted on the data that represent the different segments of the MR acquisition. For this purpose, a phase correction acquisition can be conducted. The phase correction data sets acquired in the phase correction acquisition can be evaluated and used to determine the phase curve. To determine the phase correction data sets, for example (as described in U.S. Pat. No. 6,043,651 and U.S. Pat. No. 7,492,155), a pulse sequence—said pulse sequence fundamentally corresponding to the pulse sequence used for the data acquisition implemented for the actual imaging—can be used, but not a phase coding. As is described in U.S. Pat. No. 6,043,651 and U.S. Pat. No. 7,492,155, for example, each segment of the data acquired for imaging can then be modified depending on the corresponding phase correction data set in order to reduce the influences of different phase curves.

For example, in TSE imaging for phase correction an additional echo train can be acquired with N echoes that are identical except for the missing phase coding of the echo trains of the data acquisition implemented for imaging. Each data set that is read out from one of the echoes of the data acquisition implemented for imaging can then be corrected on the basis of the associated phase correction data set. A background phase correction in EPI can be conducted with the method described in U.S. Pat. No. 6,043,651, for example. A phase correction data set that that is read out from one echo or multiple echoes given a positive readout gradient can be used to correct a data set that likewise is read out from one or multiple echoes given a positive readout gradient. Similarly, an additional phase correction data set that is read out from one echo or multiple echoes given a negative readout gradient can be used to correct an additional data set that is likewise read out from one or multiple echoes given a negative readout gradient.

A good stability of the phase correction can be achieved with methods as they are described in U.S. Pat. No. 6,043,651 and U.S. Pat. No. 7,492,155. In such methods, multiple data of a phase correction data set (for example the entirety of the data of a phase correction data set) can be used to implement a phase correction in the data acquired corresponding to the imaging. For example, parameters of a linear approximation can be determined, which linear approximation approximates an evolution of the phase along a data line in a first segment of the image data. A second linear phase curve can similarly be determined that approximates an evolution of the phase along a data line in a second segment. The first data representing the first segment can be phase-corrected using the first linear phase curve and the second data representing the second segment can be phase-corrected using the second linear phase curve.

However, the evolution of the phases in the first segment and in the second segment can exhibit developed non-linearities. Conventional methods that are based on a per-pixel phase correction, for example, can then not always sufficiently reduce image artifacts. Furthermore, the phase correction can be unsatisfactory, in particular at pixels (image points) with low signal intensity. Even in application cases in which phase correction with conventional methods generally achieves good results, image artifacts can occur precisely in the image region in which the segment of an examination subject that is relevant to the examination is depicted.

SUMMARY OF THE INVENTION

An object of the present invention is to provide methods and devices that allow the determination of phase correction parameters with which different phase curves in different segments of an MR exposure can be corrected. In particular, an object of the invention is to provide methods and devices that allow a determination of phase correction parameters with good robustness and precision, particularly for the region of the image data in which the segment of an examination subject that is relevant to an examination is depicted.

According to one aspect, a method is specified to determine phase correction parameters for first and second data determined with a magnetic resonance (MR) data acquisition.

The first data and the second data represent different segments of an MR exposure and have a different background phase curve. In the method an MR data acquisition is implemented in order to determine a first phase correction data set and a second phase correction data set, wherein the first phase correction data set has a first phase curve and the second phase correction data set has a second phase curve that differs from the first phase curve. Phase correction parameters for a phase correction of the first and/or second data are determined depending on the first phase correction data set and the second phase correction data set. The phase correction parameters are thereby determined such that they characterize a curve of a phase difference between the second phase curve and the first phase curve. The phase correction parameters are determined depending on at least one correlation between data of the second phase correction data set and data of the first phase correction data set.

Given numerous MR methods with segmented image acquisition, for example in TSE imaging or EPI imaging, the difference between the phase curves of different segments has a curve that is smoother than the phase curves of the segments. The determination of phase correction parameters that describe the difference between the first phase curve and the second phase curve can thus take place with a high degree of robustness and high precision.

The phase correction parameters can be determined depending on an argument of a correlation between data of the second phase correction data set and data of the first phase correction data set. Due to the complex conjugation in the determination of the correlation, the correlation of a datum of the second phase correction data set and a datum of the first phase correction data set has, as an argument, the phase difference of the complex-valued data so that a variable representing the phase difference can be determined in a simple manner.

The first phase correction data set can comprise at least one first series of pixels extending in a first direction, and the second phase correction data set can comprise at least one second series of pixels extending in the first direction. For example, the first phase correction data set and the second phase correction data set can respectively comprise phase correction data that are associated with positions $x_n$ along a row or along a column of MR image data. The phase correction parameters can then be determined depending on correlations $S_2(x_n) \cdot S_1^*(x_n)$ evaluated for a number of coordinates along the first direction.

$S_1(x_n)$ is a data point or data entry of the first phase correction data set at a position $x_n$ and $S_2(x_n)$ is a data point or data entry of the second phase correction data set at the position $x_n$. A curve of the phase difference between the second phase curve and the first phase curve can be determined robustly in linear, quadratic or higher approximation.

The determination of the phase correction parameters can comprise a determination of multiple parameters of a series in a coordinate of the first direction, in particular multiple coefficients of a power series in the coordinate of the first direction. The coefficients can be determined such that the row series approximates the curve of the phase difference. A few parameters can be robustly determined in this manner from a greater number of data in the first and second phase correction data sets. For example, the coefficient of 0th and 1st order of the power series can be determined. The determination of the coefficients of higher terms is likewise possible.

The coefficients can be determined depending on correlations $S_2(x_n) \cdot S_1^*(x_n)$ evaluated for a number of coordinates along the first direction.

In the method a coefficient $(\Delta\phi)_1$ of a term of the 1st order of the power series in the coordinate can be determined. This coefficient represents a locally or globally averaged slope of the curve of the phase difference between the second phase curve and the first phase curve, which are determined with high robustness and precision.

The determination of the coefficient $(\Delta\phi)_1$ of the term of the 1st order can comprise an evaluation of the variable $$\arg\{\Sigma_n f(x_n) \cdot (S_2(x_{n+1}) \cdot S_1^*(x_{n+1})) \cdot (S_2(x_n) \cdot S_1^*(x_n))^*\}. \quad (1)$$

wherein $f(x_n)$ designates a real-value function and $\arg(\cdot)$ designates the argument function that supplies the phase of a complex number. In one variant, $f(x_n)$ can be constant for all values of $x_n$ for example $f(x_n)=1$. In a further variant, $f(x_n)$ can vary dependent on $x_n$. In Equation (1) the sum can be calculated across positions n—in a variant across the coordinates n=1 through n=N−1—wherein N is the total number of pixels of the first phase correction data set or, respectively, the second phase correction data set in the first direction. In a further variant the sum can be calculated over positions n for only ln≦n≦un−1. This can in particular be advantageous for a per-segment phase correction. In this case ln and un are selected depending on the respective segment for which the coefficient $(\Delta\phi)_1$ of the term of the 1st order should be determined. A determination of the coefficient $(\Delta\phi)_1$ of the term of the 1st order according to Equation (1) contains a weighting according to signal intensities. Data with low signal intensity for which the phase can be less well-defined thus receive a lower weighting. The robustness of the method is thereby increased.

The determination of the coefficient $(\Delta\phi)_0$ of the term of the 0th order of the power series can comprise an evaluation of the variable $$\arg\{\Sigma_n g(x_n) \cdot S_1(x_n) \cdot S_1^*(x_n) \cdot \exp(i \cdot (\Delta\phi)_1 \cdot x_n)\}. \quad (2)$$

wherein $g(x_n)$ designates a real-value function. In one variant, $g(x_n)$ can be constant for all values of $x_n$, for example $g(x_n)=1$. In a further variant, $g(x_n)$ can be dependent on $x_n$. In Equation (2), the sum can be determined across positions n, again in a variant across the coordinates n=1 through n=N−1. In a further variant the sum can be calculated across positions n for only ln≦n≦un−1 if a per-segment determination of coefficients of the power series should take place. A determination of the coefficient $(\Delta\phi)_0$ of the term of the 0th order according to Equation (2) contains a weighting according to signal intensities, which increases the robustness of the method.

The determination of multiple coefficients of the power series can comprise the determination of at least one coefficient of a term of the order ≧2 in the coordinate of the first direction. Non-linearities of the curve of the phase difference can thereby be better taken into account.

The phase correction parameters can be determined per segment. The phase difference between the second phase curve and first phase curve can thereby be approximated with higher precision.

In the event that the determination of the phase correction parameter comprises a determination of multiple coefficients of a power series, the coefficients can be determined per segment for a respective segment of multiple segments offset relative to one another along the first direction. The different segments offset relative to one another can also overlap. The different segments can be different windows of what is known as a sliding window method. The phase difference between the second phase curve and the first phase curve can be approximated with greater precision via the per-segment determination of coefficients of a power series.

To determine the phase correction parameters, a spatial weighting of data of the first phase correction data set and/or of data of the second phase correction data set can be conducted. The spatial weighting can be combined with a weighting according to signal intensities. A phase correction using the phase correction parameters thus has a particularly high quality in a selectable range.

The spatial weighting can take place depending on a position of a segment of an examination subject or depending on a position of the isocenter of an MR device in the MR image, which MR device is used for data acquisition. Thus a phase correction using the phase correction parameters has a particularly high quality in a region of the image data in which a segment of interest of the examination subject is depicted, or that a phase correction using the phase correction parameters has a particularly high quality in an environment of the isocenter.

In the method at least one third phase correction data set can be determined with at least one third phase curve. Additional phase correction parameters that characterize a curve of a phase difference between the at least one third phase curve and the first phase curve can be determined depending on at least one correlation between data of at least one third phase correction data set and data of the first phase correction data set.

In this way the phase differences between more than two segments of MR image data (for example three, four or more segments of MR image data) can be corrected. One of the phase correction data sets—for example the first phase correction data set—can thereby serve as a reference with regard to which the curve of the phase differences is determined.

In the event that more than two phase correction data sets are acquired, the measures described with reference to the first and second phase correction data set can also be accordingly applied to determine the additional phase correction parameters. In particular, the additional phase correction parameters can be determined depending on an argument of a correlation between data of the at least one third phase correction data set and data of the first phase correction data set. The determination of the additional phase correction parameters can comprise a determination of a plurality of parameters of an additional series, in particular of coefficients of an additional power series. The additional series in the coordinate of the first direction can thereby approximate a curve of the phase difference between the at least one third phase curve and the first phase curve. A coefficient of the term of the power series of the 1st order in the coordinate can be determined as explained with regard to Equation (1). A coefficient of the term of the 0th order can be determined as explained with regard to Equation (2). At least one coefficient of a term of the order $\geq 2$ can be determined in the coordinate of the first direction. The additional phase correction parameters can be determined per segment. A spatial weighting can be implemented.

The method can be designed such that spin echo signals or gradient echo signals are acquired in the MR data acquisition. At least one echo signal can be read out to determine the first phase correction data set, and at least one additional echo signal that is different from the echo signal can be read out to determine the second phase correction data set. Such echo sequences are exemplary of MR sequences in which different background phase curves can occur. The first phase correction data set and/or the second phase correction data set can respectively be determined depending on data that are read out from multiple echo signals. For example, the first phase correction data set can be determined depending on data of one or more odd echo signals, and the second phase correction data set can be determined depending on data of one or more even echo signals. In one variant the first phase correction data set can be determined by averaging data that were read out from the first and the third echo signal and the second phase correction data set can be determined from data that were read out from the second echo signal.

According to a further aspect of the invention, a method is specified to determine phase correction parameters for first and second data determined with a magnetic resonance (MR) data acquisition. The first data and the second data represent different segments of an MR exposure and have a different background phase curve. In the method an MR data acquisition is implemented in order to determine a first phase correction data set and a second phase correction data set, wherein the first phase correction data set has a first phase curve and the second phase correction data set has a second phase curve that is different from the first phase curve. Phase correction parameters for a phase correction of the first and/or second data are determined depending on the first phase correction data set and the second phase correction data set. A spatial weighting of data of the first phase correction data set and/or of data of the second phase correction data set is conducted to determine the phase correction parameters. The spatial weighting allows the phase correction using the phase correction parameters to have a particularly high quality in a selectable region of the image data.

The spatial weighting can take place depending on a position of a predetermined segment of an examination subject and/or depending on a position of the isocenter of an MR device (used for data acquisition) in the MR image. The phase correction using the phase correction parameters thus has a particularly high quality in a region of the image data in which a segment of interest of the examination subject is imaged, or a phase correction using the phase correction parameters has a particularly high quality in an environment of the isocenter.

According to a further aspect, a method is specified to reduce background phase effects in a magnetic resonance (MR) data acquisition. In the method, phase correction parameters are determined with the method according to any of the aspects or embodiments of the invention. An additional MR data acquisition is implemented at an examination subject in order to determine first data and second data, wherein the first data and the second data represent different segments of an MR exposure that have a different background phase curve. A phase correction of the first data and/or the second data can be implemented depending on the determined phase correction parameters. The first data and/or the second data can be modified using phase correction parameters that can be determined with a high degree of robustness.

To implement the phase correction, either the first data or the second data can remain unchanged. If the phase correction parameters characterize a curve of a difference between the first and second phase curve, for phase correction it is sufficient to use either the first data or the second data as a reference and to conduct a phase correction on the other data relative to this reference.

The phase correction can be conducted after k-space data have been subjected to a Fourier transformation in a first direction, for example in the direction coded by the readout gradient. The phase correction of the first and second data can take place before these are subjected to a Fourier transformation in the second direction, for example in the direction coded by the phase coding gradients.

In the further MR data acquisition, a pulse sequence can be used that comprises a spatial coding in a phase coding direction. This same pulse sequence—but without the spatial coding in the phase coding direction—can be used in the MR data acquisition conducted to determine the phase correction parameters.

The invention also encompasses a non-transitory computer-readable storage medium on which is stored a computer program embodying a command sequence that—given execution by a processor of an electronic computer—cause the electronic computer to implement the method according to any of the exemplary embodiments of the invention. For example, the data medium can be a CD-ROM, a DVD, a magnetic tape, a flash memory or a USB stick on which the computer program is stored as electronically readable control information. If this control information is read from the data medium and executed by a computer of an MR device, the method according to the different aspects or embodiments can be implemented by the computer.

The invention also encompasses a magnetic resonance (MR) device that is operates to determine first and second data that represent different segments of an MR exposure and that have a different background phase curve. The device has a data acquisition device (scanner) to acquire MR data and an evaluation device to evaluate the MR data acquired with the acquisition device. The evaluation device is configured to determine phase correction parameters for a phase correction of the first and/or second data depending on a first phase correction data set acquired with the acquisition device, which first phase correction data set has a first phase curve, and depending on a second phase correction data set acquired with the acquisition device, which second phase correction data set has a second phase curve different from the first phase curve. The evaluation device is configured to determine the phase correction parameters that characterize a curve of a phase difference between the second phase curve and the first phase curve, depending on correlations between data of the second phase correction data set and data of the first phase correction data set.

As described with reference to the method according to one aspect, the determination of phase correction parameters that describe the difference between the first phase curve and the second phase curve can thus take place with a high degree of robustness and high precision.

The invention also encompasses a magnetic resonance (MR) device that is operated to determine first and second data that represent different segments of an MR exposure and that have a different background phase curve. The device has an acquisition device to acquire MR data and an evaluation device to evaluate the MR data acquired with the acquisition device. The evaluation device is configured to determine phase correction parameters for a phase correction of the first and/or second data depending on a first phase correction data set acquired with the acquisition device, and on a second phase correction data set acquired with the acquisition device, which second phase correction data set has a second phase curve different from the first phase curve. The evaluation device is configured to determine the phase correction parameters in order to conduct a spatial weighting of data of the first phase correction data set and/or of data of the second phase correction data set.

The spatial weighting allows a phase correction using the phase correction parameters to have a particularly high quality in a selectable region.

The MR devices according to the different aspects can be operated to implement a method according to any of the exemplary embodiments of the invention.

The MR device can additionally determine additional phase Correction parameters that represent a curve of a phase difference between at least one third phase curve of at least one third phase correction data set and the first phase curve. For this purpose, an argument of a correlation between data of the at least one third phase correction data set and data of the first phase correction data set can be determined. Alternatively or additionally, a spatial weighting of data of the first phase correction data set and/or the at least one third phase correction data set can be conducted in order to determine the additional phase correction parameters.

Embodiments of the present invention are particularly suitable to determine phase correction parameters for an MR imaging with segmented data acquisition, for example for a TSE imaging or EPI, without being limited to these applications.

DESCRIPTION OF THE PREFERRED EMBODIMENTS

The features of the exemplary embodiments described in the following can be combined with one another insofar as this is not explicitly precluded in the description below.

Figure 1:
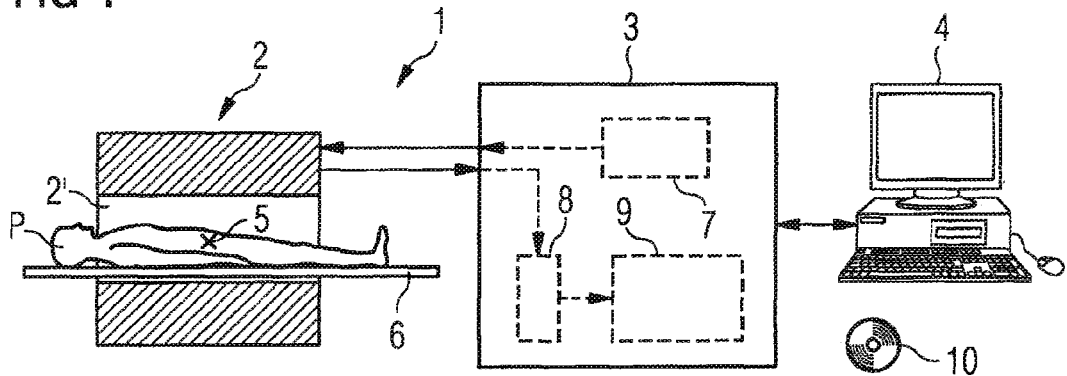
FIG. 1 schematically illustrates a magnetic resonance device according to an exemplary embodiment of the invention.

FIG. 1 schematically shows a magnetic resonance (MR) device 1 according to one exemplary embodiment. The MR device 1 has a scanner 2, a control device 3 and an evaluation computer 4. The scanner 2 has one or more coil arrangements with which the magnetic fields require for a data acquisition can be generated in a measurement space 2'. The isocenter of the B0 field is designated with 5. The scanner 2 can include gradient coils with which slice selection gradients, phase coding gradients and readout gradients can be switched. The scanner 2 furthermore includes a support device 6 on which an examination subject P is supported while a data acquisition is conducted.

The scanner 2 and the support device 6 are activated (operated) by the control device 3 such that MR data are acquired in a measurement volume that represents a segment of the examination subject P (for example a patient) supported on the support device 6. The control device 3 includes an activation unit 7, a receiver device 8 and an evaluation device 9. During the data acquisition, the receiver device 8 receives data acquired by the scanner 2. The evaluation device 9 and/or a separate evaluation computer 4 can conduct an additional processing of the data received by the evaluation device 8, for example via a translation from k-space into positional space. The subsequently described determination of phase correction parameters can be conducted by an arbitrarily suitable electronic computer or a combination of such computers, for example by the evaluation device 9, the evaluation computer 4 or the combination of the evaluation device 9 and the evaluation computer 4. A corresponding software code that induces the execution of the described method steps on this computer can be stored on a data medium 10, for example.

The control device 3 and the scanner 2 are set up such that a data acquisition can take place in a segmented manner via activation of the gradient coils and via generation of radio-frequency pulses. For example, the control device 3 and the scanner 2 can be set up such that a pulse sequence can be generated for turbo spin echo (TSE) imaging or a pulse sequence can be generated for echoplanar imaging (EPI), given which pulse sequences data from multiple echo signals can be read out. The evaluation device 9 or the evaluation computer 4 can merge the data read out from various echo signals so that an MR image is generated from the entirety of the data.

Given a per-segment data acquisition, the data are associated with the different segments of the MR exposure can have a different phase curve. Possible causes of this different phase curve are, for example, magnetic field inhomogeneities, eddy currents, time offset between pulses and the like. For example, data associated with a shift of the different segments and a phase offset between the data can result in k-space. A different phase curve in the different segments of the MR exposure results after a Fourier transformation in a direction in which the spatial coding takes place with the readout gradient, for example in the line direction.

The MR device 1 is configured to determine phase correction parameters that allow a phase correction of the data acquired for imaging. For this the control device 3 controls the scanner 2 so that at least two phase correction data sets are determined in a phase correction acquisition. The phase correction parameters are determined depending on the phase correction data sets. The MR device 1—in particular the evaluation computer 4—can furthermore be set up to conduct a phase correction of at least one of the data sets (which data sets are associated with the different segments) depending on phase correction parameters. The mode of operation of the MR device 1 according to various exemplary embodiments is described in detail with reference to FIGS. 2-19.

Figure 2:
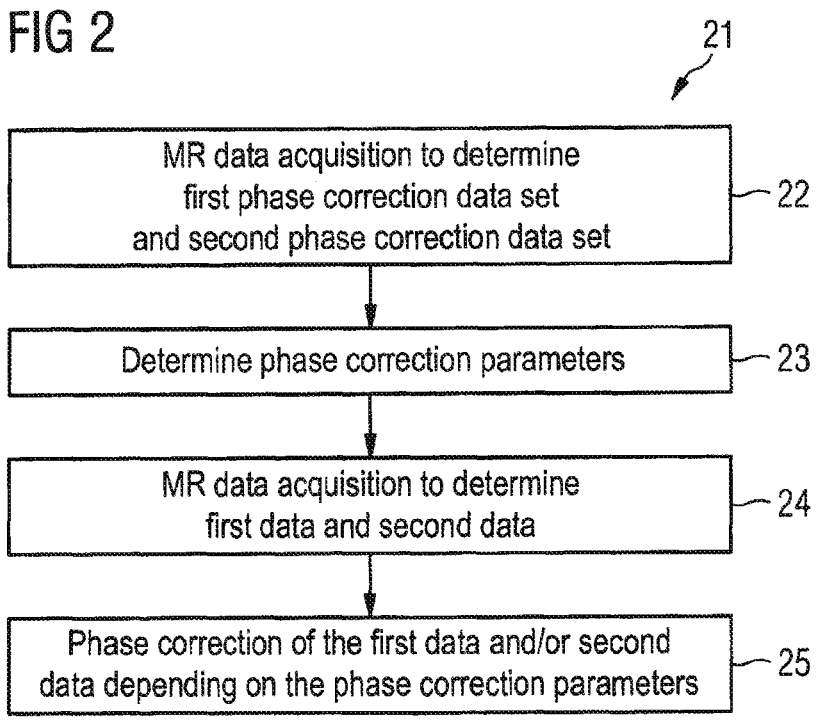
FIG. 2 is a flowchart of a method for phase correction according to one exemplary embodiment.

FIG. 2 is a flow diagram depiction of a method 21 for phase correction according to an exemplary embodiment that can be conducted by the MR device 1.

A first phase correction data set and a second phase correction data set are acquired in 22. The MR data acquisition takes place such that the two phase correction data sets have different phase curves.

Phase correction parameters are determined in 23. The determination of the phase correction parameters is described in detail with reference to FIG. 3-19.

For actual imaging an additional MR data acquisition is conducted at 24 in order to determine first data and second data that represent different segments of an MR exposure. The first data and the second data have different phase curves.

A phase correction of the first data and/or the second data is conducted at 25 depending on the phase correction parameters.

In the method the MR data acquisition conducted at 22 takes place to determine the phase correction data sets, and the MR data acquisition conducted at 24 takes place to acquire the data for the imaging such that the phase curves of the phase correction data sets determined at 22 allow conclusions of the phase curves of the data determined at 24. For example, the MR data acquisition at 22 can take place such that a first phase curve of the first phase correction data set in a direction—for example in a line direction—essentially corresponds to a background phase curve of the first data in the line direction or to a background phase curve (averaged over various lines) of the first data in the line direction. The MR data acquisition at 22 can take place such that a second phase curve of the second phase correction data set in a direction (for example in a line direction) corresponds to a background phase curve of the second data in the line direction or to a background phase curve (averaged over various lines) of the second data in the line direction.

The pulse sequence used for MR data acquisition at 22 can be selected depending on the pulse sequence used for MR data acquisition at 24. For example, the pulse sequence used at 24 can correspond to the pulse sequence used at 22, wherein the switching of phase coding gradients is suppressed, however. For illustration, the pulse sequence used at 24 can correspond to the pulse sequence for a TSE imaging or EPI, and the pulse sequence used at 22 can be the same pulse sequence, wherein the application of a phase coding gradient can be foregone, however.

The determination of the phase correction data sets can take place so that the first and second phase correction data set are determined by reading out differing echo signals of a spin or gradient echo sequence. For example, in an EPI the first phase correction data set can be determined by readout of a first and a third echo signal and averaging the data, and the second phase correction data set can be determined by reading out a second echo signal, as this is described in U.S. Pat. No. 6,043,651, for example.

In the method 21 an MR data acquisition is schematically depicted to determine two phase correction data sets and an additional MR data acquisition is schematically depicted to determine first and second data. However, the method 21 and all methods described with reference to FIG. 3-19 to determine phase correction parameters can also be applied to an MR imaging with a greater number of image segments. Furthermore, in this case at least one third phase correction data set can be acquired at 22. Correspondingly, data that are associated with at least three segments of the MR exposure can be acquired at 24. For example, for phase correction in TSE imaging an additional echo train with multiple echoes—in general N echoes—can be acquired at 22 that equates to the echo trains of the additional MR data acquisition at 24 except for the missing phase coding.

The following methods to determine phase correction parameters are described with reference to FIG. 3-19. The determination of phase correction data sets at 22 and the determination of the phase correction parameters at 23 in FIG. 2 can be implemented with the described methods. The methods can be implemented by the MR device 1.

Figure 3:
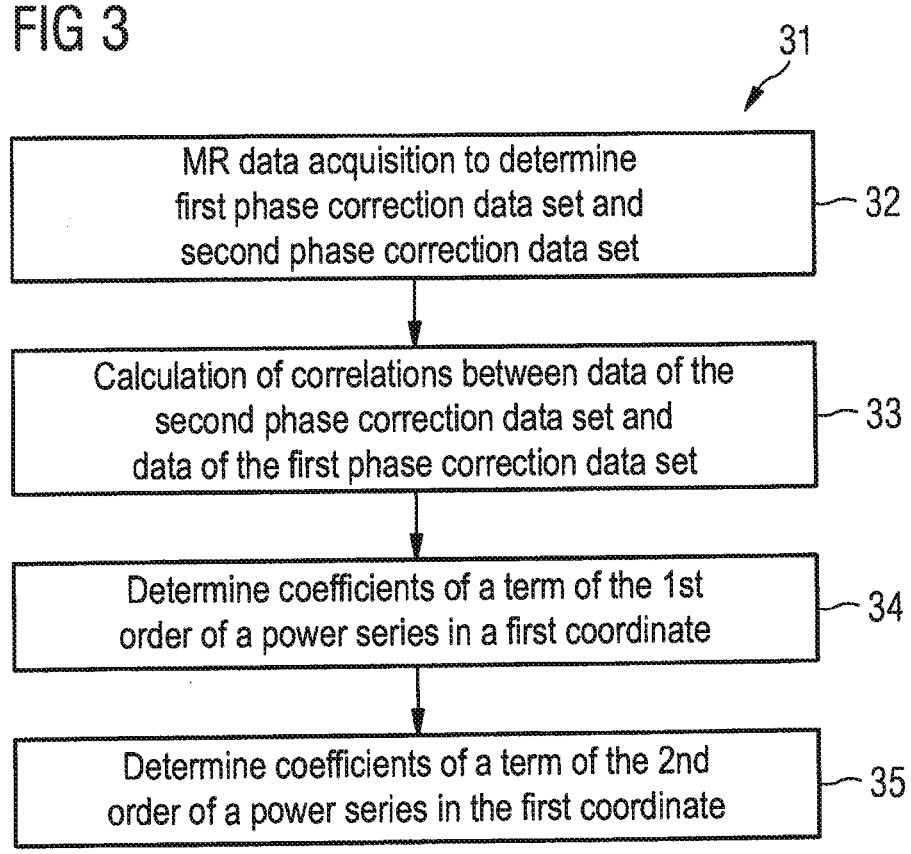
FIG. 3 is a flowchart of a method to determine phase correction parameters according to one exemplary embodiment.

FIG. 3 is a flow chart depiction of a method 31 to determine phase correction parameters.

A first phase correction data set and a second phase correction data set are determined at 32. This can take place as described with reference to Step 22. The first phase correction data set comprises a plurality of pixels in positional space that extend in a first direction, for example in a line direction. The second phase correction data set can likewise comprise a plurality of pixels in positional space that extend in the first direction, for example in the line direction. The first phase correction data set has a first phase curve. The second phase correction data set has a second phase curve that is different from the first phase curve.

Correlations between data of the second phase correction data set and data of the first phase correction data set are calculated at 33. The correlations can respectively comprise a product of a datum of one of the phase correction data sets with a complexly conjugated datum of the other of the phase correction data sets. For this the correlation $C(x_n)=S_2(x_n) \cdot S_1^*(x_n)$ can be determined for multiple positions $x_n$ along the first direction, for example the line direction, wherein $S_1(x_n)$ is a datum of the first phase correction data set at the position $x_n$ and $S_2(x_n)$ is a datum of the second phase correction data set at the position $x_n$. If the data of the first and second phase correction data set extend in the line direction, $x_n$ represents a column n so that $x_n=n$ can be set. $S_1(x_n)$ and $S_2(x_n)$ are complex numbers. The argument of the correlation—$arg(C(x_n))$—is equal to the phase difference between the phase of $S_2(x_n)$ and the phase of $S_1(x_n)$.

At 34 and 35 the coefficient $(\Delta\phi)_1$ of a term of the 1st order and the coefficient $(\Delta\phi)_0$ of a term of the 0th order of a power series in the coordinate of the first direction are determined. The coefficients are determined such that the function $$\Delta\phi(x_n) = (\Delta\phi)_0 + (\Delta\phi)_1 \cdot x_n \quad (3)$$

approximates the phase differences $arg(C(x_n))$

The coefficients $(\Delta\phi)_0$ and $(\Delta\phi)_1$ of the linear power series expansion of Equation (3) can be determined in various ways. Embodiments can be based on the method of least squares, for example. As will be described in further detail with reference to FIG. 10-15, the power series can comprise additional terms of higher order whose coefficients are determined.

According to one embodiment, the coefficient $(\Delta\phi)_1$ of the term of the 1st order is determined according to $$(\Delta\varphi)_1 = \arg\left\{\sum_{n=1}^{N-1} f(x_n) \cdot (S_2(x_{n+1}) \cdot S_1^*(x_{n+1})) \cdot (S_2(x_n) \cdot S_1^*(x_n))^*\right\} \quad (4)$$

$$= \arg\left\{\sum_{n=1}^{N-1} f(x_n) \cdot C(x_{n+1}) \cdot C^*(x_n)\right\}$$

$f(x_n)$ thereby designates a real-value function that allows a spatial weighting, as will be described in further detail. The function $arg(\cdot)$ is the argument function that delivers the phase of a complex number. The asterisk (*) designates the complex conjugation. N is the number of pixels of the first and second phase correction data set that extend in the first direction. In the event that the first and second phase correction data extend along the line direction, N is the number of columns of the MR image. As was mentioned, the correlation $C(x_n)$ has the difference of the phase of $S_2(x_n)$ and the phase of $S_1(x_n)$ as an argument. A weighting according to signal intensities takes place via the calculation according to Equation (4). The coefficient $(\Delta\phi)_1$ is determined from the self-weighted autocorrelation of the determined correlations $C(x_n)$. This is advantageous since the coefficient $(\Delta\phi)_1$ is determined independent of phase jumps possibly occurring in the curve of the phase difference. Phase jumps in the curve—i.e. depending on $x_n$—can occur based on the value range of the argument function, which is limited to $[-\pi, +\pi]$ or a different interval of length $2\pi$.

According to one embodiment, the coefficient $(\Delta\phi)_0$ of the term of the 0th order can be determined according to $$(\Delta\varphi)_0 = \arg\left\{\sum_{n=1}^{N-1} g(x_n) \cdot S_1(x_n) \cdot S_2^*(x_n) \cdot \exp(i \cdot (\Delta\varphi)_1 \cdot x_n)\right\} \quad (5)$$

$g(x_n)$ thereby designates a real-value function that allows a spatial weighting, as will be described in further detail later. The coefficient $(\Delta\phi)_0$ is thereby determined from the self-weighted cross-correlation of data of the first phase correction data set and data of the second phase correction data set. This embodiment is also particularly advantageous for the aforementioned reason.

In one embodiment, $f(x_n)=1$ can be selected in Equation (4) and $g(x_n)=1$ can be selected in Equation (5), such that no spatial weighting of data [sic] in the determination of the parameters $(\Delta\phi)_0$ and $(\Delta\phi)_1$. As will be described In further detail with reference to FIG. 10-15, $f(x_n)$ and/or $g(x_n)$ can also be variable as a function of $x_n$.

As is clear from Equations (3)-(5), two phase correction parameters $(\Delta\phi)_0$ and $(\Delta\phi)_1$ are determined from the entirety of the data of the first phase correction data set and the data of the second phase correction data set. A self-weighting according to signal intensities is provided in the calculation according to Equations (4) and (5). The phase correction parameters can thereby be determined robustly.

The determined parameters can be used for phase correction of the first and second data acquired for actual imaging. The first or, respectively, second data can be represented as data $I_1(x_n)$ or, respectively, $I_2(x_n)$ that respectively extend in the first direction. For example, the data $I_1(x_n)$ can be obtained via Fourier transformation of first k-space data in the first direction, for example the line direction, and the pixels $I_2(x_n)$ can be obtained via Fourier transformation of second k-space data in the first direction, for example the line direction. The phase correction can then be implemented such that the phase-corrected data are determined depending on the phase correction parameters $$I_1'(x_n)=I_1(x_n)\cdot\exp(-i\cdot c_1\cdot[(\Delta\phi)_0+(\Delta\phi)_1\cdot x_n])_{und} \quad (6)$$

$$I_2'(x_n)=I_2(x_n)\cdot\exp(-i\cdot c_2\cdot[(\Delta\phi)_0+(\Delta\phi)_1\cdot x_n]) \quad (7)$$

$c_1$ and $c_2$ are thereby real numbers that satisfy $$c_2-c_1=1 \quad (8)$$

After the phase correction the Fourier transformation of the data can be implemented in a second direction in order to obtain image data in positional space.

In the method 31 only relative phase errors are determined and corrected, i.e. the curve of the difference of the second and first phase curve. It is therefore not necessary to subject both the first and second data to a phase correction. For example, $c_1=0$ can be selected. $c_2=0$ can alternatively be selected.

Depending on the pulse sequence used for MR data acquisition, additional data lines of the MR acquisition can likewise be phase-corrected based on $(\Delta\phi)_0$ and $(\Delta\phi)_1$. For example, all odd lines of the MR exposure can be phase-corrected according to Equation (6) and all even lines of the MR exposure can be phase-corrected according to Equation (7). For example, in EPI it can be sufficient to determine the phase correction parameters that represent the curve of the phase difference between a second phase curve of data read out from even echoes and a first phase curve of data read out from odd echoes. As was already mentioned, it is not necessary that the first phase correction data set and the second phase correction data set are respectively read out from precisely one echo signal. For example, the first phase correction data set can be determined via averaging of data that are read out from a first echo signal and a third echo signal.

Depending on the pulse sequence used for MR data acquisition, for the implementation of the phase correction it can be required to acquire additional phase correction data sets in the event that the MR exposure consists of more than two segments with different phase curves. In this case at least one third phase correction data set can be determined. For the third phase correction data set, additional phase correction parameters $(\Delta\phi^{(31)})_0$ and $(\Delta\phi^{(31)})_1$ can be determined that approximate the curve of the phase difference between a third phase curve of the third phase correction data set and the first phase curve of the first phase correction data set corresponding to Equation (3). The additional phase correction parameters can be determined as explained with reference to Equations (4) and (5). Additional phase correction parameters can accordingly be determined for additional segments of the MR exposure. A phase correction of the data that are associated with the different segments can then take place according to $$I_1'(x_n)=I_1(x_n), \quad (9)$$

$$I_2'(x_n)=I_2(x_n)\cdot\exp(-i\cdot[(\Delta\phi)_0+(\Delta\phi)_1\cdot x_n]), \quad (10)$$

$$I_3'(x_n)=I_3(x_n)\cdot\exp(-i\cdot[(\Delta\phi^{(31)})_0+(\Delta\phi^{(31)})_1\cdot x_n]), \text{ and} \quad (11)$$

$$I_M'(x_n)=I_M(x_n)\cdot\exp(-i\cdot[(\Delta\phi^{(M1)})_0+(\Delta\phi^{(M1)})_1\cdot x_n]), \quad (12)$$

wherein M is the total number of segments with different phase curve in the MR data acquisition. For example, the data $I_1(x_n)$, $I_2(x_n)$, etc. can be obtained via Fourier transformation of k-space data in the first direction (for example the line direction), wherein $x_n$ indicates the position along the line direction. The first segment of the image data serves in Equations (9)-(12) as a reference, in relation to which the curve of phase differences is determined and corrected. Alternatively, every other segment of the image data can be used as a reference in relation to which the curve of phase differences is determined and corrected. After implementing a phase correction according to Equations (9)-(12), the image data can be determined in positional space via Fourier transformation of the phase-corrected data in a second direction.

The method from FIG. 3 is explained further with reference to FIG. 4-9 using exemplary data.

Figure 4:
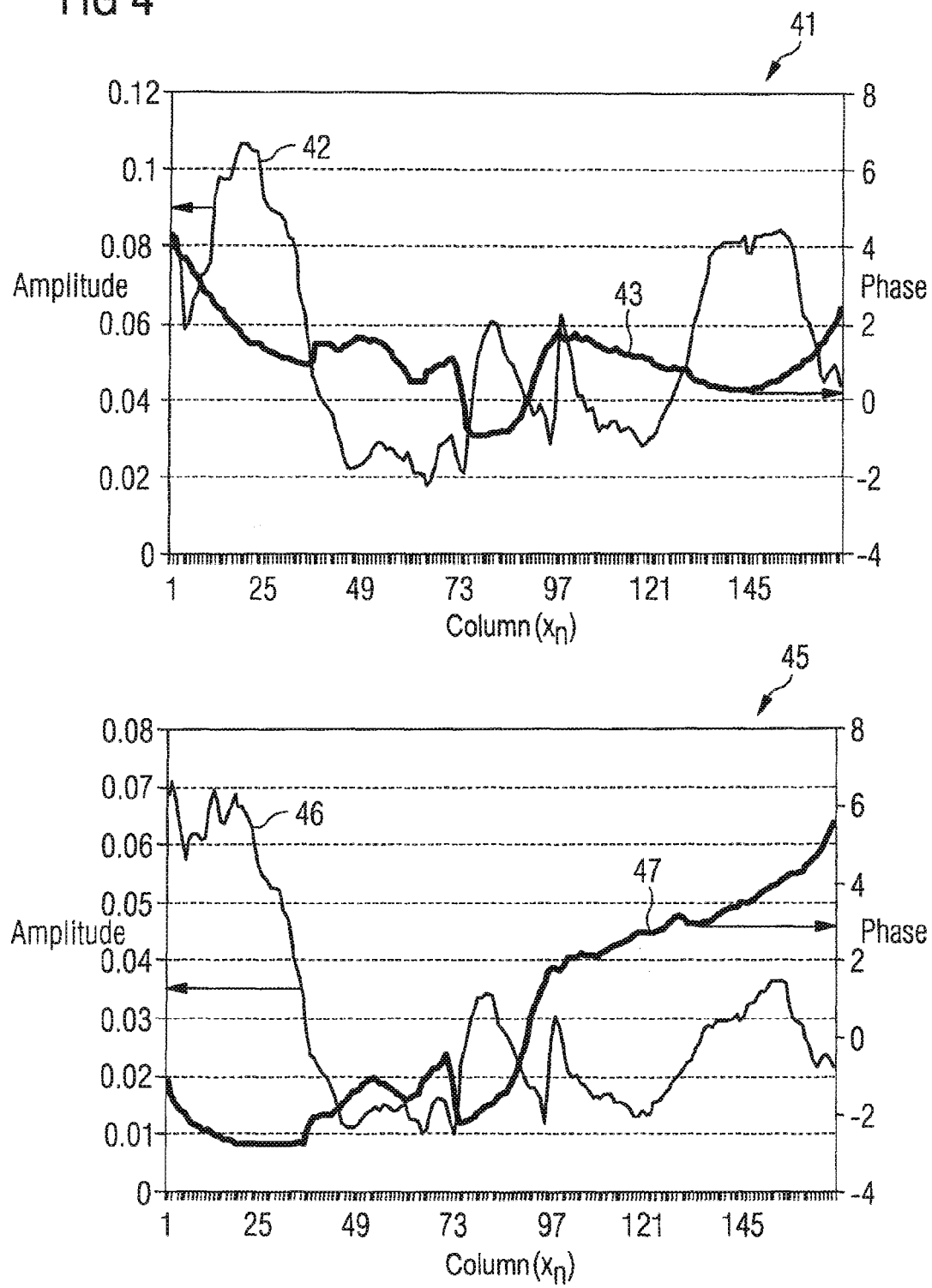
FIG. 4 illustrates a first phase correction data set and a second phase correction data set.

FIG. 4 shows in graph 41 an amplitude $|S_1(x_n)|$ of a first phase correction data set 42 and a phase $arg(S_1(x_n))$ of the first phase correction data set 43 as a function of the position $x_n$ that represents the respective column n of the image. FIG. 4 furthermore shows in Graph 45 an amplitude $|S_2(x_n)|$ of a second phase correction data set 46 and a phase $arg(S_2(x_n))$ of the second phase correction data set 47 as a function of the position $x_n$ that represents the respective column n of the image. The phases are represented in a radian measure. For reasons of clarity, the value range has been expanded by a continuity analysis beyond the typical interval $[-\pi, +\pi]$. The exemplary first phase correction data set was determined by readout of the data of the first and third echo in an EPI without phase coding and subsequent averaging. The exemplary second phase correction data set was determined via readout of the data of the second echo in EPI without phase coding. The first phase curve 43 and the second phase curve 47 differ from one another. Without phase correction, the different phase curves of data read out between even and odd echoes can lead to significant artifacts.

Figure 5:
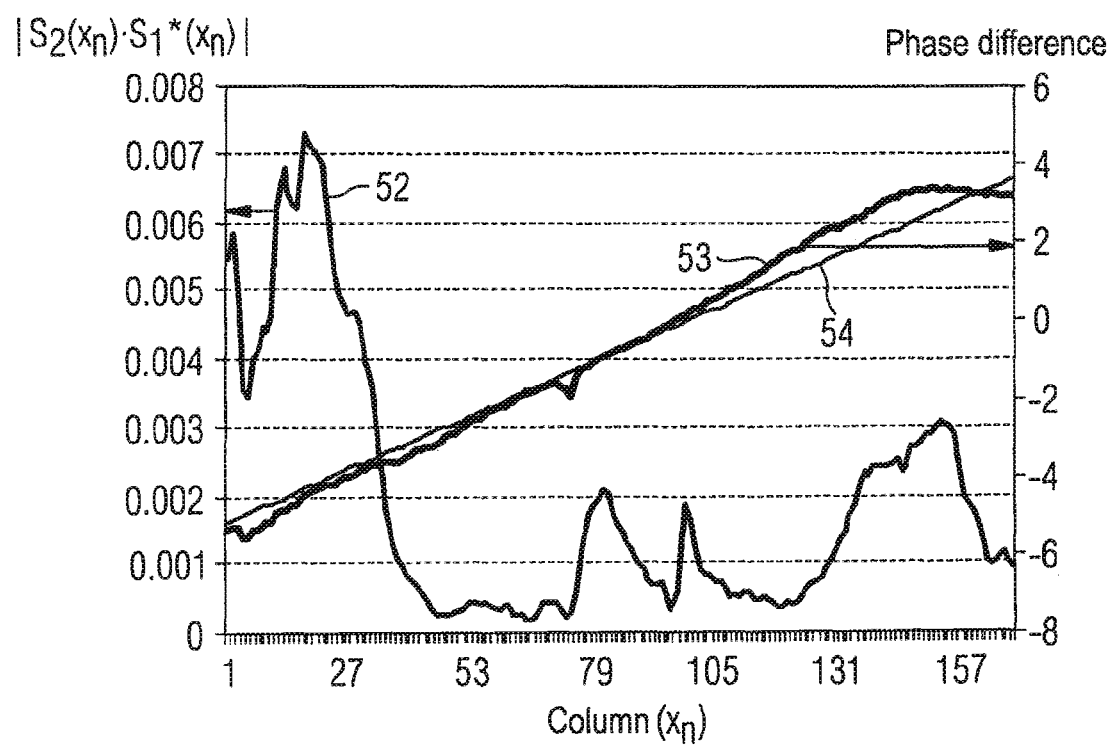
FIG. 5 illustrates the magnitude and phase of a correlation between data of the second phase correction data set and data of the first phase correction data set from FIG. 4 and a linear approximation of the curve of the phase difference.

FIG. 5 shows a diagram in which a magnitude 52 and a phase 53 of correlations $C(x_n)=S_2(x_n)\cdot S_1^*(x_n)$ between the data of the second phase correction data set and the data of the first phase correction data set from FIG. 4 are shown. The phase 53 of the correlations represent the curve of the phase difference between the second phase curve 47 and the first phase curve 43. The curve of the phase difference between the second phase curve 47 and the first phase curve 43 is smoother than the first phase curve 43 and the second phase curve 47. This allows an approximation via a polynomial of lower order, for example via a linear function as it is specified in Equation (3).

At 54 FIG. 5 furthermore shows the linear approximation $\Delta\phi(x_n)=(\Delta\phi)_0+(\Delta\phi)_1\cdot x_n$ of the curve of the phase difference 53, which linear approximation is determined according to Equations (3)-(5) without spatial weighting, i.e. with $f(x_n)=1$ and $g(x_n)=1$. The approximation 54 well approximates the curve of the phase difference 53, in particular in the central image region.

Figure 6:
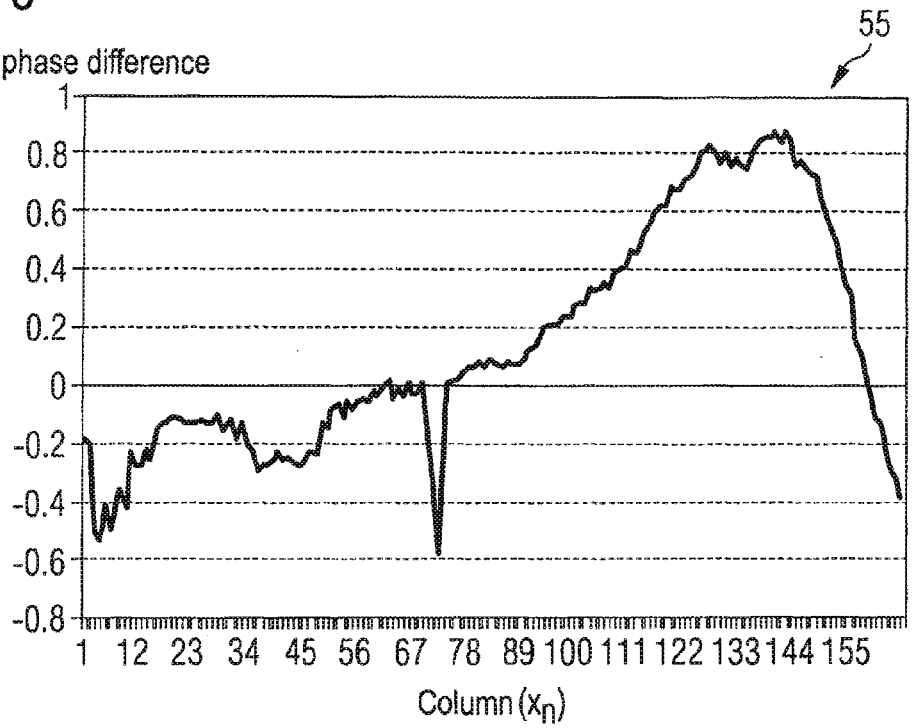
FIG. 6 shows a curve of a residual phase difference between a second phase curve and a first phase curve of the phase correction data sets from FIG. 4 given implementation of the method according to an exemplary embodiment.

FIG. 6 is a representation 55 of a residual phase difference in radian measure as a function of the location when the phase correction parameters were determined with the method from FIG. 3. The residual phase difference corresponds to the phase difference between the phase curve of $S_2(x_n)\cdot\exp[-i\cdot\Delta\phi(x_n)]$ and $S_1(x_n)$. The residual phase difference is provided by the difference of the approximation 54 and the curve of the phase difference 53 in FIG. 4. The residual phase difference is a measure of the quality of a phase correction that is implemented using the determined phase correction parameters. For the data of FIG. 4, the residual phase difference is less than 1 given use of the phase correction parameters determined with the method from FIG. 3.

Figure 7:
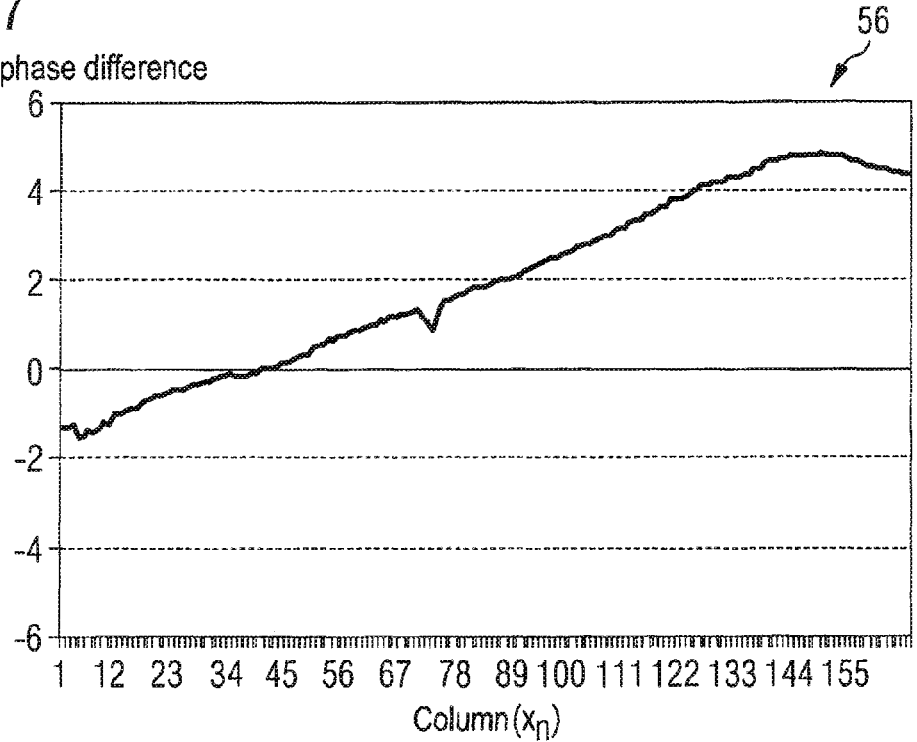
FIG. 7 is a comparative depiction of a curve of a residual phase difference given linear approximation of the phase curves of the first and second phase correction data set that was not determined according to an exemplary embodiment.

For comparison, in the depiction 56 FIG. 7 shows the residual phase difference in the degree measure as a function of the location when phase correction parameters are determined not based on the curve of the phase difference between the second phase curve 47 and the second phase curve 43 but rather via approximation of the first phase curve 43 and the second phase curve 47. For this a first linear function is determined for the first phase curve 43 as an approximation of the first phase curve 43. A second linear function for the second phase curve 47 is determined as an approximation of the second phase curve 47. A phase correction of the first phase correction data set is implemented using the first linear function. A phase correction of the second phase correction data set is implemented using the second linear function. The phase difference between the second phase correction data set phase corrected in such a manner and the first phase correction data set phase corrected in such a manner is represented as a residual phase difference. As is apparent from a comparison of FIG. 7 with FIG. 6, the residual phase difference using the phase correction parameters obtained with the method according to an exemplary embodiment is smaller than given the comparison example from FIG. 7.

Figure 8:
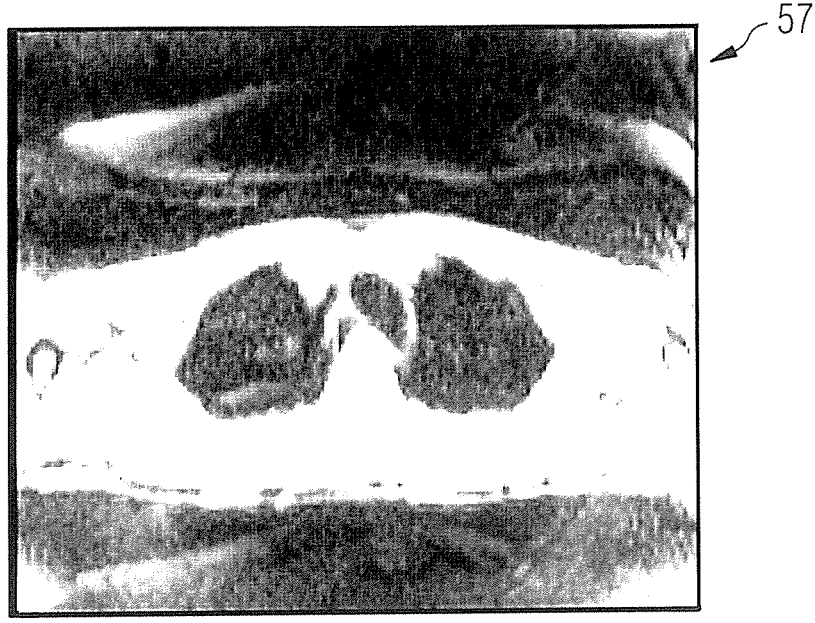
FIG. 8 is a depiction of MR image data after implementation of a phase correction with phase correction parameters that were determined with a method according to an exemplary embodiment.
Figure 9:
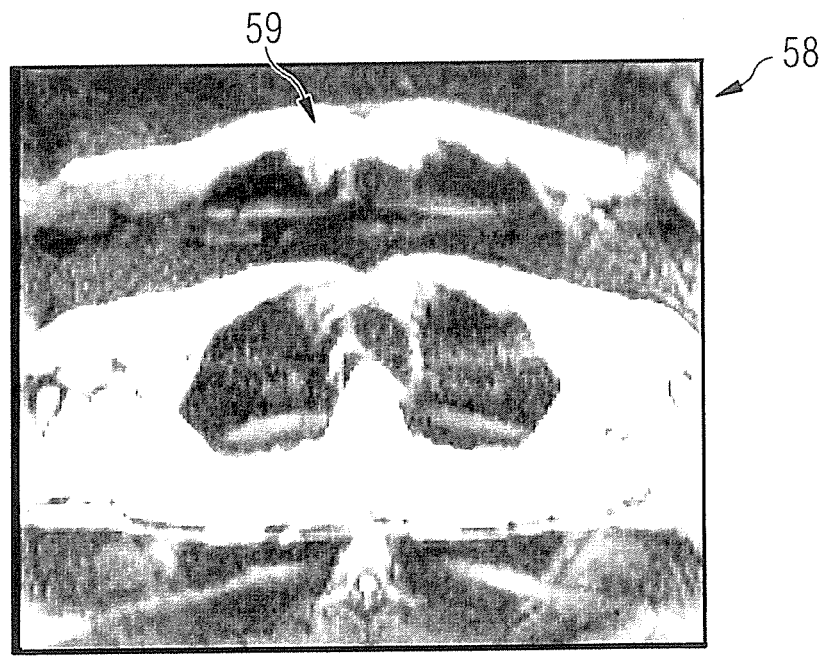
FIG. 9 is a comparative depiction of MR image data after implementation of a phase correction with phase correction parameters that were determined based on a linear approximation of the phase curves of the first and second phase correction data set.

FIG. 8 is a representation of an MR image 57 and FIG. 9 is a comparison representation of an MR image 58 whose data were acquired by means of EPI. The MR images 57 and 58 are based on the same raw data that were acquired with an EPI pulse sequence. To generate the MR image 57, a phase correction of the first data and the second data that were read out from different echoes was conducted with the method from FIG. 2 and FIG. 3. No spatial weighting—i.e. $f(x_n)=1$ in Equation (4) and $g(x_n)=1$ in Equation (5)—was thereby conducted. To generate the MR image 58, a first linear function was determined as an approximation of the first phase curve 43 and the first data (odd lines) of the MR image 58 were phase-corrected depending on the first linear function. Furthermore, a second linear function was determined as an approximation of the second phase curve 48 and the second data (straight lines) of the MR image 58 were phase-corrected depending on the second linear function. The MR image 58 has artifacts 59 that are suppressed in the MR image 57 in which the phase correction was implemented with a method according to an exemplary embodiment.

The method from FIG. 3 allows a phase correction with a high degree of robustness and precision. As is apparent from FIG. 5 and FIG. 6, however, it can lead in individual image regions to larger deviations between a linear approximation of $\arg(C(x_n))$ and $\arg(C(x_n))$. This can lead to the situation that artifacts are not as strongly suppressed in particular in edge regions of MR images as in regions in which the linear approximation to $\arg(C(x_n))$ and $\arg(C(x_n))$ significantly coincide. Different developments of the method explained with reference to FIG. 3 are described with reference to FIG. 10-18. The developments can be applied individually or in combination. The developments contain a spatial weighting of phase correction data; and/or a determination of a greater number of phase correction parameters, for example a determination of at least three coefficients of a series expansion; and/or a per-segment determination of phase correction parameters.

Figure 10:
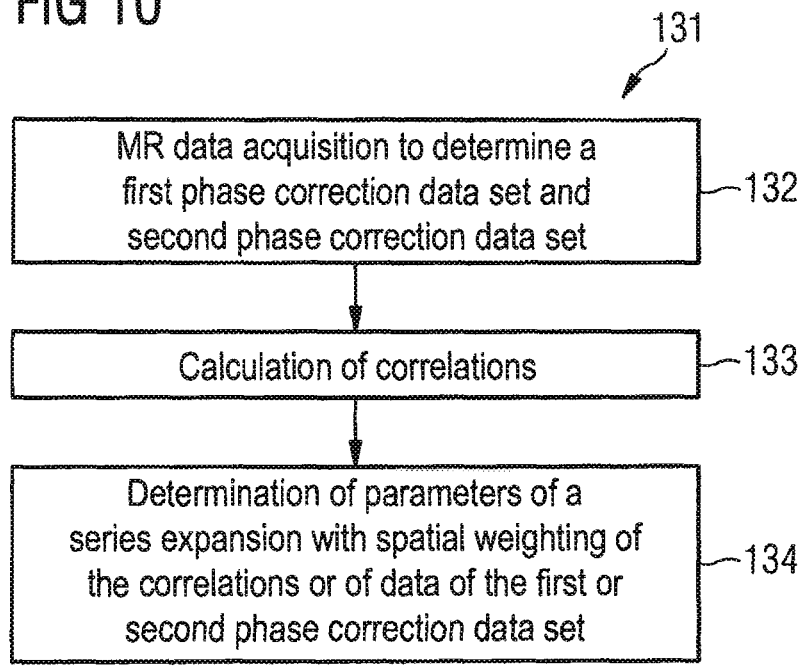
FIG. 10 is a flowchart of a method to determine phase correction parameters according to a further exemplary embodiment.

FIG. 10 is a flow diagram depiction of a method 131 to determine phase correction parameters according to a further exemplary embodiment. In the method 131, a spatial weighting is conducted in order to determine the phase correction parameters. The method comprises the implementation of an MR data acquisition to determine a first phase correction data set and a second phase correction data set in 132, which can be implemented like the MR data acquisition 32 of the method 31. The method furthermore comprises the calculation of correlations at 133, which can be implemented like the calculation of correlations 33 of the method 31.

At 134 parameters of a series—for example coefficients of a power series—in the coordinate of the first direction are determined so that the series approximates the curve of the phase difference. The parameters can comprise at least one coefficient $(\Delta\phi)_0$ of a term of the 0th order and a coefficient $(\Delta\phi)_1$ of a term of the 1st order of a power series in a coordinate of the direction in which the data of the phase correction data sets extend, for example a power series in the column Index. A spatial weighting is thereby conducted. A spatial weighting can be conducted in various ways. In one embodiment the complexly conjugated product of the correlation functions in Equation (4) is weighted with the real-value function $f(x_n)$. For example, $$f(x_n)=0.5+0.5\cdot\cos(2\cdot\pi\cdot(n-N/2)/N) \qquad (13)$$

can be selected (Hanning filter). Alternatively or additionally, in Equation (5) each summand can be weighted with the real-value function $g(x_n)$. For example, $$g(x_n)=0.5+0.5\cdot\cos(2\cdot\pi\cdot(n-N/2)/N) \qquad (14)$$

can be selected (Hanning filter). In further embodiments, for example, $$f(x_n)=0.25\cdot[1+\cos(2\cdot\pi\cdot(n-N/2)/N)]^2 \qquad (15)$$

can be selected. Other weighting functions can likewise be selected.

As is illustrated in Equations (13) and (14), a weighting can take place such that central values of the phase correction data sets receive high weighting and values at the edge of the phase correction data sets receive lower weighting. Alternatively, the weighting can also take place independent of in which position of the first and second phase correction data sets the isocenter 5 of the MR device 1 is imaged. Alternatively, the weighting can also take place independent of in which position of the first and second phase correction data sets a segment of the examination subject (for example a specific organ or a specific vessel branch that should be imaged with high precision in the imaging) is imaged. Via the spatial weighting a high quality of the phase correction in a predetermined region of the MR image can be specifically achieved in the determination of phase correction parameters.

As an alternative to a spatial weighting in the calculation of the coefficients as this is achieved via a function $f(x_n)$ (variably as a function of the location) in Equation (4) or via a function $g(x_n)$ (variably as a function of the location) in Equation (5), data of the first phase correction data set and/or of the second phase correction data set and/or the determined correlations can also be spatially weighted, and the phase correction parameters can then be determined based on the weighted data.

Figure 11:
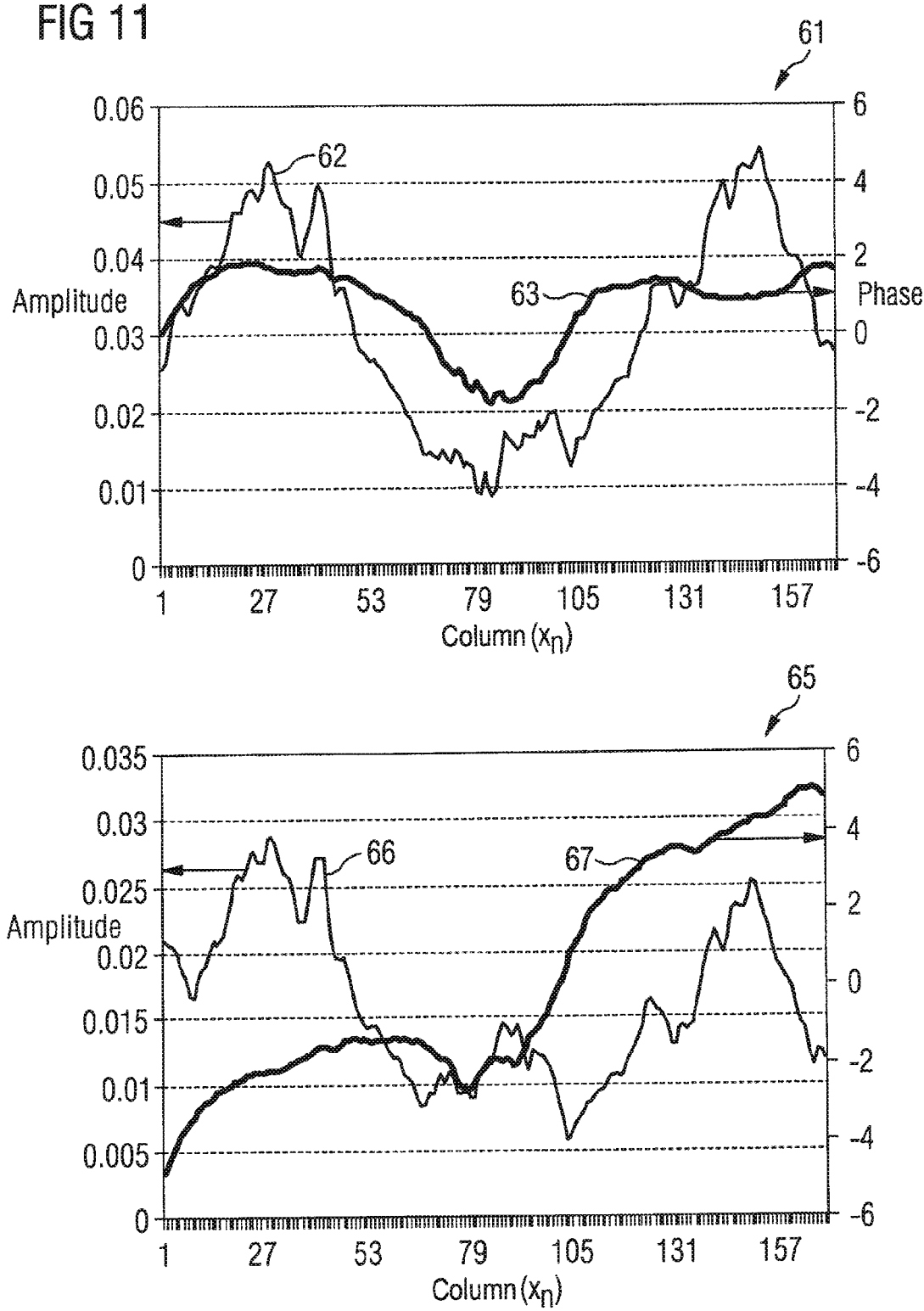
FIG. 11 is a depiction of a first phase correction data set and a second phase correction data set.

The method from FIG. 10 is explained further with reference to FIG. 11-15 using exemplary data. To illustrate the effects of the spatial weighting, an imaging of a slice of an examination subject is thereby shown in which the correlations $C(x_n)=S_2(x_n)\cdot S_1^*(x_n)$ of data of the second and first phase correction data set in edge regions exhibit a high magnitude and a developed, non-linear response of the argument from $C(x_n)$. In Graph 61 FIG. 11 shows an amplitude $|S_1(x_n)|$ of a first phase correction data set 62 and a phase $\arg(S_1(x_n))$ of the first phase correction data set 63 as a function of the position $x_n$ that represents the respective column n of the image. In Graph 65 FIG. 11 furthermore shows an amplitude $|S_2(x_n)|$ of a second phase correction data set 66 and a phase $\arg(S_2(x_n))$ of the second phase correction data set 67 as a function of the position $x_n$ that represents the respective column n of the image. The phases are represented in a radian measure. The exemplary first phase correction data set was determined by reading out the data of the first and third echo of an EPI without phase coding and subsequent averaging. The exemplary second phase correction data set was determined by reading out the data of the second echo of the EPI without phase coding. The first phase curve 63 and the second phase curve 67 differ from one another.

Figure 12:
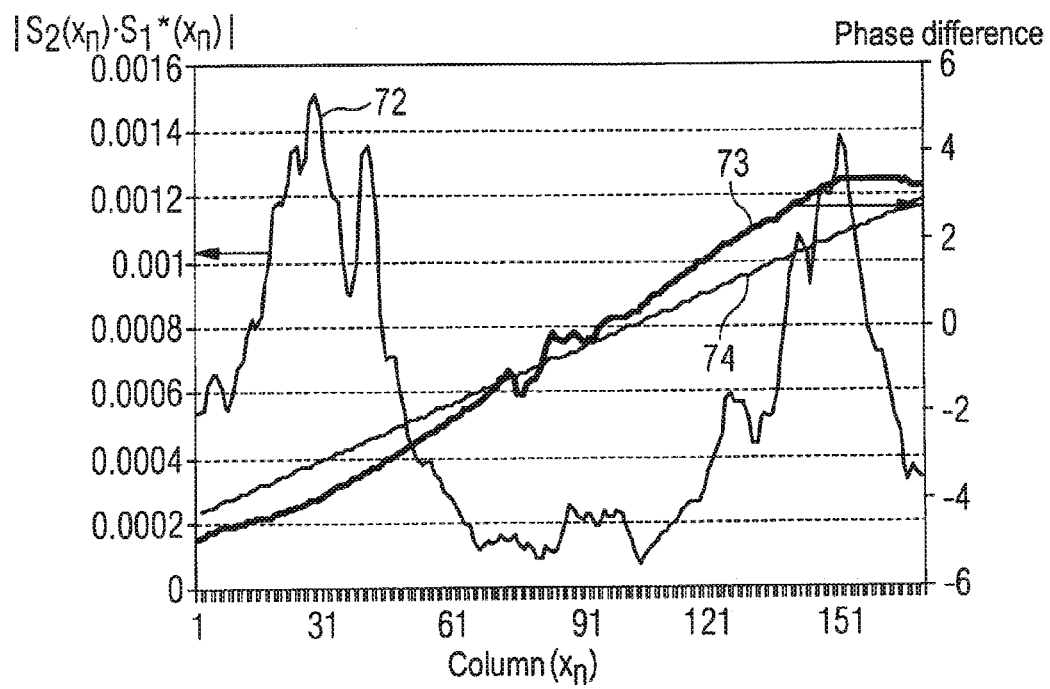
FIG. 12 shows the magnitude and phase of a correlation between data of the second phase correction data set and data of the first phase correction data set from FIG. 11 and a linear approximation of the curve of the phase difference that was determined without spatial weighting.

FIG. 12 shows a diagram in which are shown a magnitude 72 and a phase 73 of correlations $C(x_n)=S_2(x_n) \cdot S_1^*(x_n)$ between the data of the second phase correction data set and the data of the first phase correction data set from FIG. 11. The phase 73 of the correlations represents the curve of the phase difference between the second phase curve 67 and the first phase curve 63. The curve of the phase difference between the second phase curve 67 and the first phase curve 63 is smoother than the first phase curve 63 and the second phase curve 64. In edge regions—in given small and large values of n—$C(x_n)$ has a large magnitude and a developed, non-linear response of the phase as a function of the position.

Furthermore, at 74 FIG. 12 shows the linear approximation $\Delta\phi(x_n)=(\Delta\phi)_o (\Delta\phi)_1 \cdot x_n$ of the curve of the phase difference 73, which linear approximation is determined according Equations (3)-(5) without spatial weighting, i.e. with $f(x_n)=1$ and $g(x_n)=1$. In the edge regions the approximation 74 shows deviations of up to 1.5 from the curve of the phase difference 73. In general, the signal-weighted determination of phase correction parameters can lead to systematic deviations between the linear approximation of the curve of the phase difference and the curve of the phase difference in the event that segments with high signal portion show a developed non-linear phase variation.

Figure 13:
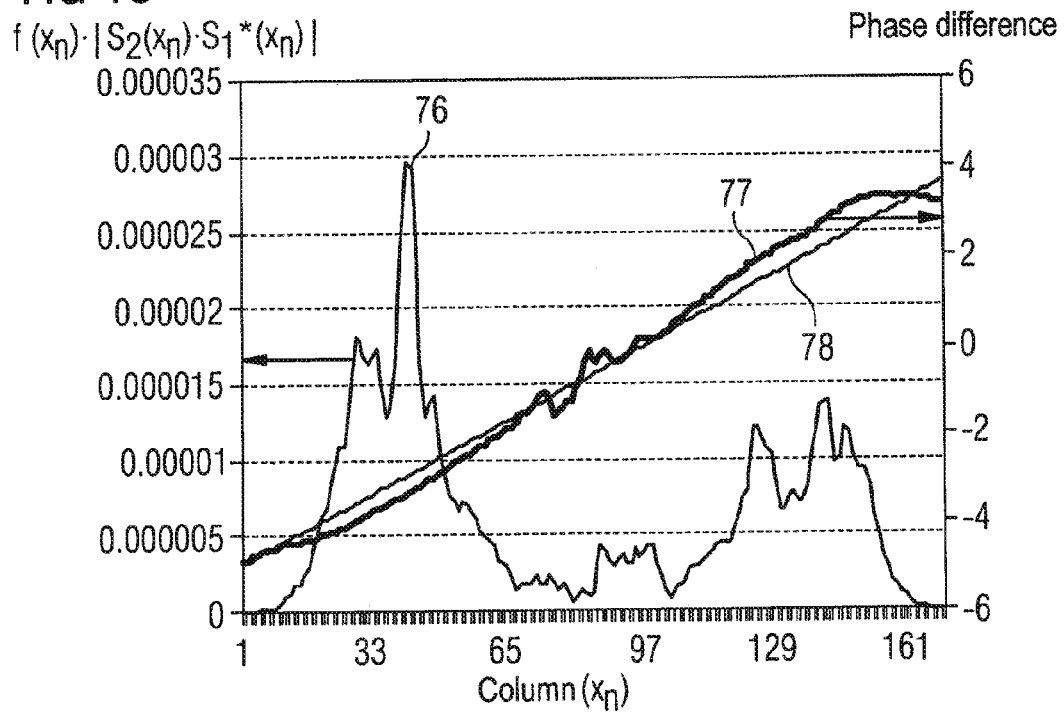
FIG. 13 shows the magnitude and phase of a correlation between data of the second phase correction data set and data of the first phase correction data set from FIG. 11 and a linear approximation of the curve of the phase difference that was determined with spatial weighting.

FIG. 13 shows a diagram in which are shown a magnitude 76 and a phase 77 of correlations $C(x_n)=S_2(x_n) \cdot S_1^*(x_n)$ between the data of the second phase correction data set and the data of the first phase correction data set from FIG. 11, which correlations are spatially weighted with $f(x_n)$ according to Equation (14). The weighting with the Hanning filter function leads to a lower weighting of the values in the edge regions.

Furthermore, at 78 FIG. 13 shows the linear approximation $\Delta\phi(x_n)=(\Delta\phi)_0+(\Delta\phi)_1 \cdot x_n$ of the curve of the phase difference 77, which linear approximation is determined according Equations (3)-(5) without spatial weighting. The phase correction parameters determined with spatial weighting provide a linear approximation of the curve of the phase difference 77 that—in comparison to the approximation determined without spatial weighting—also shows smaller deviations from the curve of the phase difference 77 in a central region, i.e. in particular given 30≦n≦140.

Figure 14:
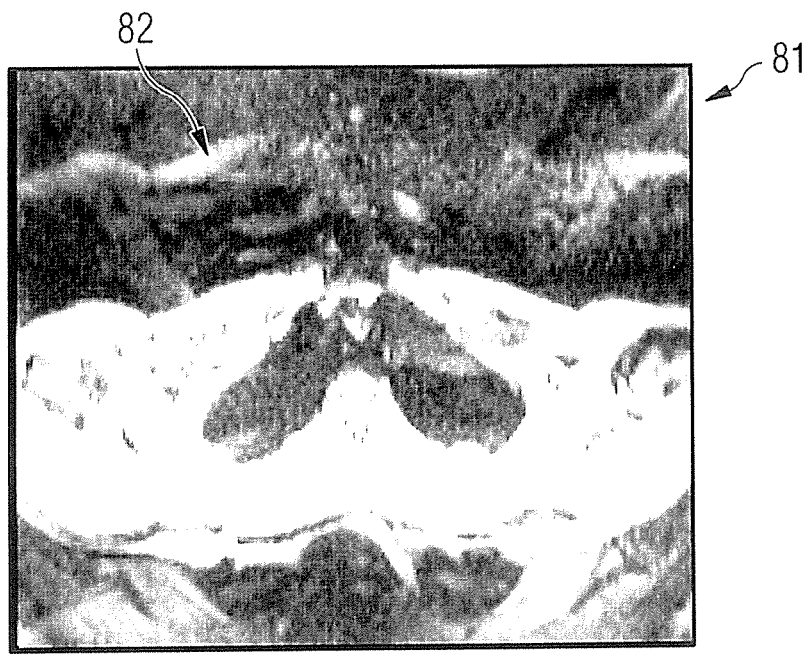
FIG. 14 is a depiction of MR image data after implementation of a phase correction with phase correction parameters that were determined with a method according to an exemplary embodiment without spatial weighting.
Figure 15:
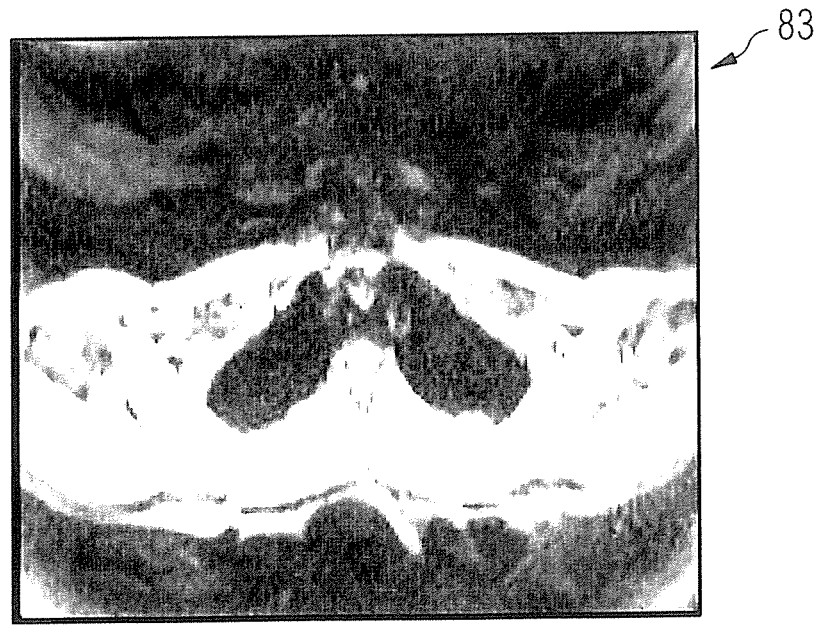
FIG. 15 is a depiction of MR image data after implementation of a phase correction with phase correction parameters that were determined with a method according to an exemplary embodiment with spatial weighting.

FIG. 14 is a depiction of an MR image 81 and FIG. 15 is a comparative representation of an MR image 83 whose image data was acquired by means of EPI. The MR images 81 and 83 are based on the same raw data that were acquired with an EPI pulse sequence. To generate the MR image 81, a phase correction of the first data and the second data that were read out from different echoes was conducted without spatial weighting with the method from FIG. 3, i.e. $f(x_n)=1$ in Equation (4) and $g(x_n)=1$ in Equation (5). To generate the MR image 83, a phase correction of the first data and the second data that were read out from different echoes was conducted with spatial weighting with the method from FIG. 10, wherein $f(x_n)$ and $g(x_n)$ according to Equations (13) and (14) were used. The MR image 81 has artifacts 82 that are reduced in the MR image 83, in which the phase correction was conducted with a method with spatial weighting according to an exemplary embodiment.

An additional development of the devices and methods described with reference to FIG. 1-15 is that more than two parameters of a series are determined, for example more than two coefficients of a power series that approximates the curve of the phase difference between phase curves of second and first phase correction data sets. In the event that the series is a power series, the coefficients of the power series $$\Delta\varphi(x_n) = \sum_{j=0}^{L} (\Delta\varphi)_j \cdot x_n^j \qquad (16)$$

are determined so that $\Delta\phi(x_n)$ approximates the phase differences $\arg(C(x_n))$. L≦N is thereby the order of the highest power of the series and $(\Delta\phi)_j$ are the coefficients of the power series. The order of the power series in Equation (16) can be greater than or equal to 2. The coefficients $(\Delta\phi)_j$ can be determined with known methods. For example, a method based on the method of least squares can be applied in order to determine the coefficients $(\Delta\phi)_j$. In one embodiment the method described in U.S. Pat. No. 5,614,827 to determine shim currents can be used correspondingly to determine the coefficients $(\Delta\phi)_j$.

While a power series in the coordinate along which the first and second phase correction data sets have pixels is depicted in Equation (16), a series expansion can also be used in other basic functions, for example in trigonometric functions in the coordinate.

Via consideration of a greater number of terms in a series expansion, the quality of the phase correction can be further increased. As was described with reference to FIG. 4-6 and FIG. 11-13, given typical pulse sequences for MR data acquisition the phase difference $\arg(C(x_n))$ has a smooth curve in comparison to the individual phase curves of the phase correction data sets, which smooth curve facilitates the robust determination of more than two phase correction parameters.

Figure 16:
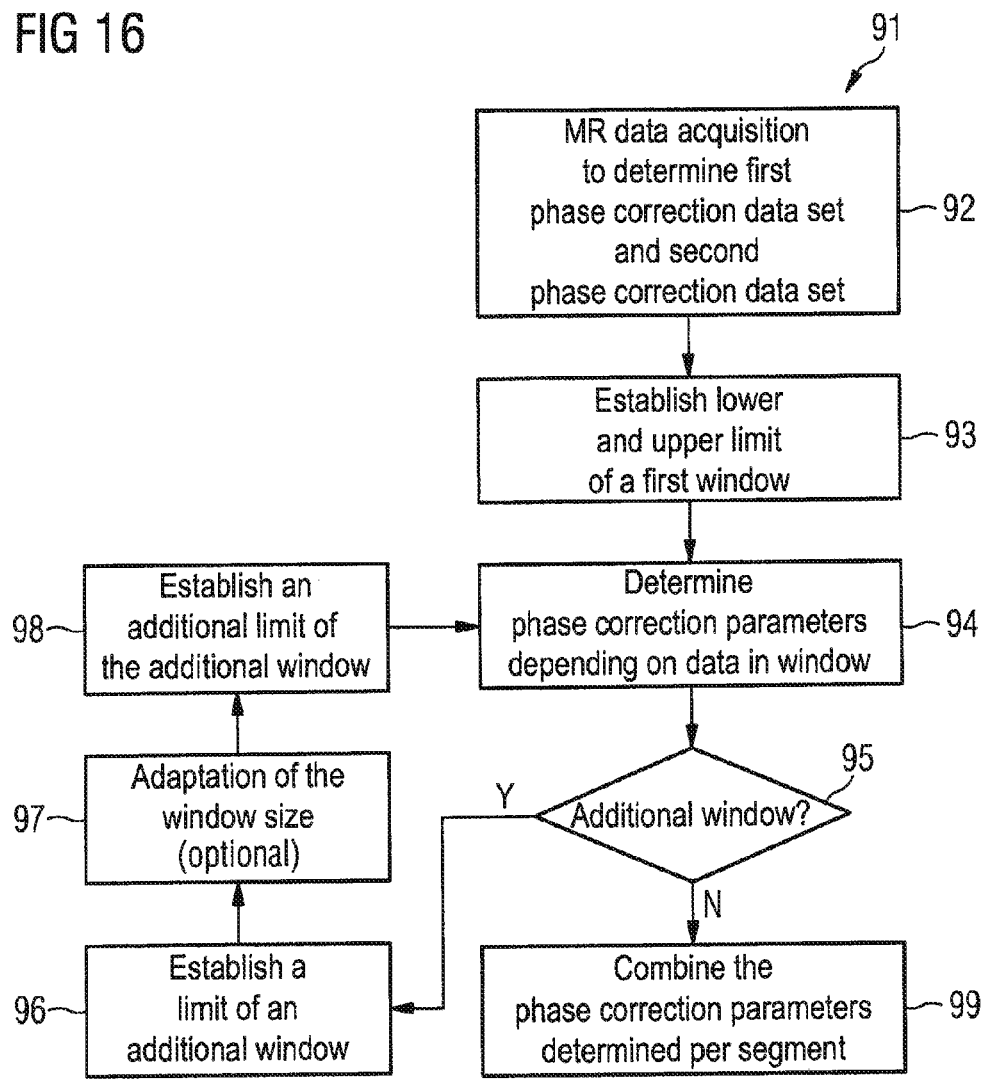
FIG. 16 is a flowchart depiction of a method to determine phase correction parameters according to a further exemplary embodiment.

FIG. 16 is a flow diagram depiction of a method 91 to determine phase correction parameters according to an additional exemplary embodiment. In the method the phase correction parameters are determined per segment for a plurality of segments that are offset against one another along a line, for example. The segments offset against one another can also partially overlap with one another. The method can be based on what is known as a sliding window method, in which a window is shifted and phase correction parameters are determined for different window positions. For each segment, phase correction parameters associated with this segment can be determined with each of the methods described with reference to FIG. 3-15. The phase correction parameters can be used for phase correction of first and second data, as was described with reference to FIG. 2, for example.

At 92 an MR data acquisition is conducted to determine first and second phase correction data sets. Step 92 can be implemented like Step 32 of the method 31.

At 93 a lower limit and an upper limit of a first window are established. The window extends along the first direction in which pixels of the first and second phase correction data set extend. For example, the window can cover a segment of a line from a column ln to a column un.

At 94, phase correction parameters are determined depending on the data of the first phase correction data set and the second phase correction data set that are arranged within the established window. The phase correction parameters are thereby determined so that they characterize a curve of a phase difference between a second phase curve of the second phase correction data set and a first phase curve of the first phase correction data set within the window. The phase correction parameters for the respective window are determined only depending on correlations of data of the second and first phase correction data set that are arranged in the respective window.

At 95 it is checked whether the phase correction parameters should be determined for an additional window. In the event that this is affirmed, the method proceeds at 96.

At 96-98, the limits of the additional window are established. A window size can thereby be varied adaptively. To establish the additional window—for example at 96—a lower limit of the additional window can be established. At 97, a window size can be selected. At 98 an upper limit of the additional window can be established depending on the lower limit and the window size. The method proceeds with the determination of phase correction parameters at 94 in the additional window.

In the event that it is established at 95 that the phase correction parameters are not determined for an additional window, at 99 the phase correction parameters determined per-segment are combined. For example, for this an approximation function defined per segment can be determined by combining approximation functions of the phase difference $\arg(C(x_n))$ that are determined for the different segments. Given overlapping windows, in the overlap region an interpolation or, respectively, an averaging can be conducted between the approximation functions determined per segment.

The determination of the phase correction parameters at 94 can be implemented for each segment according to the different methods described with reference to FIG. 3-15. For example, in one embodiment coefficients $(\Delta\phi)_0$ and $(\Delta\phi)_1$ of a linear function can be determined according to Equation (3) for the different segments according to $$(\Delta\varphi)_1 = \arg\left\{\sum_{n=ln}^{un-1} f(x_n) \cdot (S_2(x_{n+1}) \cdot S_1^*(x_{n+1})) \cdot (S_2(x_n) \cdot S_1^*(x_n))^*\right\} \quad (17)$$

$$= \arg\left\{\sum_{n=ln}^{un-1} f(x_n) \cdot C(x_{n+1}) \cdot C^*(x_n)\right\}$$

and $$(\Delta\varphi)_0 = \arg\left\{\sum_{n=ln}^{un-1} g(x_n) \cdot S_1(x_n) \cdot S_2^*(x_n) \cdot \exp(i \cdot (\Delta\varphi)_1 \cdot x_n)\right\}. \quad (18)$$

$f(x_n)$ and $g(x_n)$ thereby designate real-value functions that allow a spatial weighting. The lower limit of the respective window is designated with ln, and the upper limit of the respective window is designated with un. $f(x_n)=1$ and $g(x_n)=1$ can be selected in one embodiment. The phase correction parameters can also be determined otherwise per segment. For example, parameters of a series expansion—for example coefficients of a power series—can be determined with more than three terms, as was described with reference to Equation (15).

At 97 the adaptation of the window size can be selected depending on the position of the window. For example, in edge regions a window can be selected with a first width. In a central image region a window with a second width can be selected, wherein the second width is greater than the first width. A smaller window width is advantageous in order to map the non-linear curve of $\arg(C(x_n))$ in the edge regions with higher precision in the approximation function used to correct the image data. The size of the window is thereby respectively selected at least such that a low number of phase correction parameters, for example the coefficients $(\Delta\phi)_0$ and $(\Delta\phi)_1$ defined for the window, is determined in the window from a larger data set of the first and second phase correction data sets so that the determination of the locally defined parameters remains robust.

Figure 17:
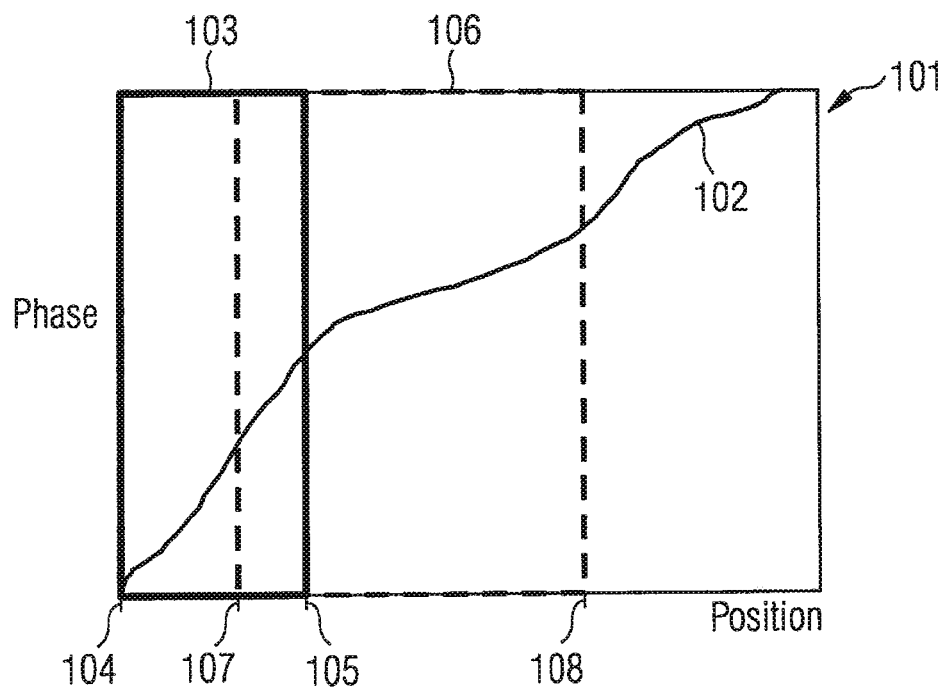
FIG. 17 is a depiction of a curve of a phase difference as a function of the location to explain the method from FIG. 16.
Figure 18:
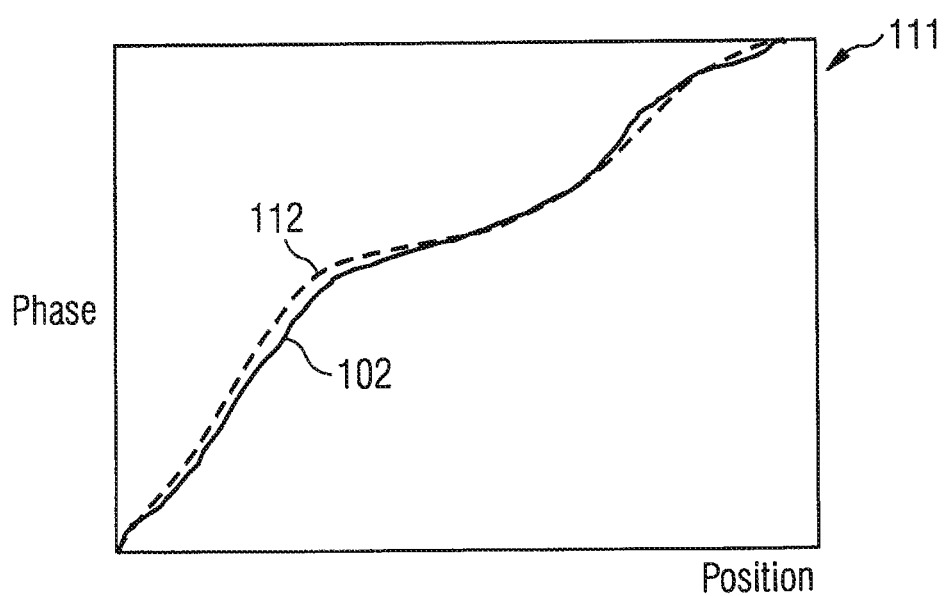
FIG. 18 is a depiction of an approximation of the curve of the phase difference determined with the method according to FIG. 16.

FIG. 17 is a representation 101 of a curve of a phase difference 102 provided by $\arg(C(x_n))$ as a function of the location to explain the method from FIG. 16. A window 103 that extends from a lower limit 104 to an upper limit 105 and an additional window 106 that extends from a lower limit 107 to an upper limit 108 are thereby depicted. The width of the window 103 arranged in an edge region is smaller than the width of the centrally arranged window 106. In each of the windows, a set of phase correction parameters can respectively be determined depending on the data of the first and second phase correction data sets $S_1(x_n)$ and $S_2(x_n)$ and depending on the correlations $C(x_n)$ derived from these. For example, the phase correction parameters can comprise coefficients of a power series that are determined according to Equations (17) and (18). FIG. 18 is a depiction 111 that schematically represents the curve of an approximation function 112 to the curve of the phase difference 102, which approximation function 102 is determined by combining the phase correction parameters determined for the different windows. The quality of the phase correction can be increased via the per-segment determination. The numerical ancillary cost is moderate given implementation of a per-segment determination of the phase correction parameters.

With reference to FIG. 11-18, developments of the method from FIG. 3 are described in the context of a determination of phase correction parameters for an MR image with two segments. Methods in which phase correction parameters are determined using a spatial weighting and/or using a series expansion with more than two terms and/or per segment can also be implemented for a per-segment data acquisition in which the MR image has more than two segments with different phase curve. For this at least one third phase correction data set is acquired with at least one third phase curve and additional phase correction parameters are determined that characterize the curve of the phase difference between the at least one third phase correction data set and the first phase correction data set.

Figure 19:
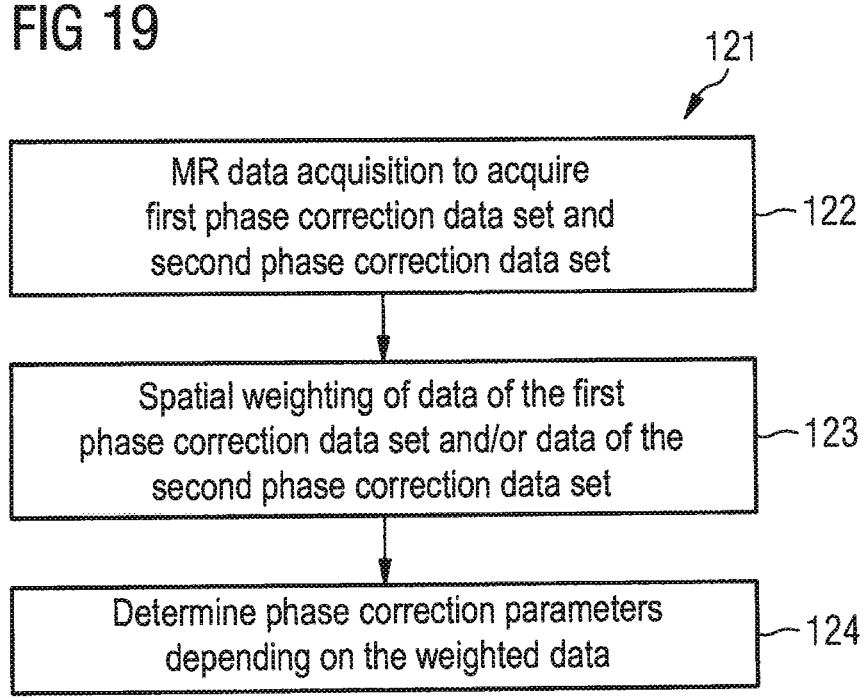
FIG. 19 is a flowchart of a method to determine phase correction parameters according to a further exemplary embodiment.

With reference to FIG. 10-15, a method according to an exemplary embodiment is explained in which phase correction parameters that characterize the curve of a phase difference are determined using a spatial weighting. According to additional embodiments of the invention, a spatial weighting of phase correction data sets can also be provided given methods to determine phase correction parameters in which the phase correction parameters are not determined depending on correlations between data of the second and first phase correction data set. FIG. 19 is a flow diagram depiction of a method 121 to determine phase correction parameters according to a further exemplary embodiment. At 122 an MR data acquisition is implemented in order to determine first and second phase correction data sets. Step 122 can be implemented like Step 32 of the method 31. At 123 a spatial weighting of the data of the first phase correction data set and/or of the data of the second phase correction data set can be implemented. For this the data can be weighted, for example with a Hanning filter function. At 124 phase correction parameters are determined depending on the weighted data of the first and second phase correction data set. The determination of the phase correction parameters at 124 can take place with the methods described in U.S. Pat. No. 7,492,155 or in U.S. Pat.

No. 6,043,651, for example, wherein the weighted data of the phase correction data set are used as initial data for the respective method.

Exemplary embodiments of the invention were described with reference to Figures. Modifications of the exemplary embodiments described in detail can be realized in additional exemplary embodiments. While methods and devices were described as examples with regard to the phase correction of an MR image with two segments that have different phase curve, the methods and devices can also be used corresponding to the phase correction in per-segment data acquisition when the MR image has more than two segments with different phase curve. While methods and devices were described in which coefficients of a power series that approximates the curve of the phase difference are determined, in additional embodiments the phase correction parameters can for example be parameters of a series expansion that is not necessarily a power series. While methods and devices were described in which the MR data acquisition takes place with TSE or EPI pulse sequences, methods and devices can generally be used for phase correction of MR images in which the MR data acquisition leads to the situation that multiple segments in the MR images have different phase curves. While methods and devices were described in which a phase correction of data in positional space takes place, in additional embodiments the phase correction can also take place in k-space based on the curve of a phase difference between phase curves of multiple phase correction data sets.

Exemplary embodiments of the invention allow the phase correction in MR image data. Methods and devices according to exemplary embodiments can generally be used in MR imaging, for example in medical MR imaging.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to determine phase correction parameters for first data and second data acquired with a magnetic resonance data acquisition unit, said first data and said second data respectively representing different segments of a magnetic resonance exposure that exhibit respectively different background phase curves, said method comprising the steps of:
    operating said magnetic resonance data acquisition unit to acquire first phase correction data and second phase correction data, said first phase correction data having a first phase curve and said second phase correction data having a second phase curve that differs from said first phase curve; and
    supplying said first and second phase correction data sets to a computerized processor and, in said computerized processor, automatically determining phase correction parameters for a phase correction of at least one of said first data and said second data, said phase correction parameters defining a difference curve of a phase difference between said second phase curve and said first phase curve, depending on correlations between data in said second phase correction data set and data in said first phase correction data set.

2. A method as claimed in claim 1 wherein said first phase correction data set comprises at least one first series of pixels extending in a first direction, and wherein said second phase correction data set comprises at least one second series of pixels extending in said first direction, and comprising determining said phase correction parameters as multiple coefficients of a power series in a coordinate of said first direction.

3. A method as claimed in claim 2, comprising determining the coefficients of the series depending on correlations $$S_2(x_n) \cdot S_1^*(x_n)$$

evaluated for a plurality of coordinates along the first direction, wherein $S_1(x_n)$ is a datum of the first phase correction data set at a position $x_n$ and $S_2(x_n)$ is a datum of the second phase correction data set at the position $x_n$.

4. A method as claimed in claim 3, comprising determining a coefficient $(\Delta\phi)_1$ of a term of the 1st order of a power series is determined.

5. A method as claimed in claim 4, comprising the coefficient $(\Delta\phi)_1$ of the term of the 1st order by an evaluation of the variable $$\arg\left\{\sum_n f(x_n) \cdot (S_2(x_{n+1}) \cdot S_1^*(x_{n+1})) \cdot (S_2(x_n) \cdot S_1^*(x_n))^*\right\},$$

wherein $f(x_n)$ is a real-value function.

6. A method as claimed in claim 2 comprising determining the multiple coefficients of the series by determining at least one coefficient of a power of the order $\geq 2$ in the coordinate of the first direction.

7. A method as claimed in claim 2 comprising determining the phase correction parameters respectively for individual segments among multiple segments that are offset relative to each other along said first direction.

8. A method as claimed in claim 1 comprising determining said phase correction parameters by spatially weighting at least one of said data of said first phase correction data set and said data of said second phase correction data set.

9. A method as claimed in claim 8 comprising spatially weighting said at least one of said data of said first phase correction data set and said data of said second phase correction data set using a weighting factor selected from the group consisting of weighting factors that depend on a position of a segment of an examination subject from which said first phase correction data set and said second phase correction data set were acquired, and weighting factors dependent on a position of an isocenter of said magnetic resonance data acquisition unit.

10. A method as claimed in claim 1 comprising acquiring said first and second correction data sets using echo signals selected from the group consisting of spin echo signals and gradient echo signals, by reading out at least one echo signal to a acquire said first phase correction data set and reading out at least one additional echo signal, different from said at least one echo signal, to acquire said second phase correction data set.

11. A method as claimed in claim 1 comprising:
    operating said magnetic resonance data acquisition unit to acquire at least one third phase correction data set having a third phase curve; and
    in said processor, determining additional phase correction parameters that characterize a difference curve between said third phase curve and said first phase curve, depending on at least one correlation between data of said at least one third phase correction data set and data of said first phase correction data set.

12. A method to determine phase correction parameters for first data and second data acquired with a magnetic resonance data acquisition unit, said first data and said second data respectively representing different segments of a magnetic resonance exposure that exhibit respectively different background phase curves, said method comprising the steps of:

operating said magnetic resonance data acquisition unit to acquire first phase correction data and second phase correction data, said first phase correction data having a first phase curve and said second phase correction data having a second phase curve that differs from said first phase curve; and supplying said first and second phase correction data sets to a computerized processor and, in said computerized processor, automatically determining phase correction parameters for phase correction of at least one of said first data set and said second data set, dependent on said first phase correction data set and said second phase correction data set by spatially weighting data from at least one of said first phase correction data set and data of said second phase correction data set.

13. A method as claimed in claim 12 comprising spatially weighting said at least one of said data of said first phase correction data set and said data of said second phase correction data set using a weighting factor selected from the group consisting of weighting factors that depend on a position of a segment of an examination subject from which said first phase correction data set and said second phase correction data set were acquired, and weighting factors dependent on a position of an isocenter of said magnetic resonance data acquisition unit.

14. A method as claimed in claim 12 comprising:

operating said magnetic resonance data acquisition unit to acquire said first data and said second data from said different regions of said MR exposure, that respectively exhibit different background phase curves; and in said processor, phase correcting at least one of said first data and said second data using said phase correction parameters.

15. A method as claimed in claim 14 comprising phase correcting only said first data or only said second data with said phase correction parameters.

16. A magnetic resonance system comprising:

a magnetic resonance data acquisition unit adapted to interact with an examination subject;

a computerized control unit configured to operate said magnetic resonance data acquisition unit to acquire first phase correction data and second phase correction data, said first phase correction data having a first phase curve and said second phase correction data having a second phase curve that differs from said first phase curve; and a computerized processor supplied with said first and second phase correction data sets, said computerized processor being configured to automatically determine phase correction parameters for a phase correction of at least one of said first data and said second data, said phase correction parameters defining a difference curve of a phase difference between said second phase curve and said first phase curve, depending on correlations between data in said second phase correction data set and data in said first phase correction data set, and to make said correction parameters available in electronic form at an output of said processor.

17. A magnetic resonance system comprising:

a magnetic resonance data acquisition unit adapted to interact with an examination subject;

a computerized control unit configured to operate said magnetic resonance data acquisition unit to acquire first phase correction data and second phase correction data, said first phase correction data having a first phase curve and said second phase correction data having a second phase curve that differs from said first phase curve; and a computerized processor supplied with said first and second phase correction data sets, said computerized processor being configured to automatically determining phase correction parameters for phase correction of at least one of said first data set and said second data set, dependent on said first phase correction data set and said second phase correction data set by spatially weighting data from at least one of said first phase correction data set and data of said second phase correction data set, and to automatically phase-correct at least one of said first and second data sets using said phase correction parameters.

18. A non-transitory computer-readable storage medium encoded with programming instructions, said storage medium being loadable into a computerized control and processing system of a magnetic resonance system, said magnetic resonance system also comprising a magnetic resonance data acquisition unit that is adapted to interact with an examination subject, said programming instructions causing said computerized control and processing system to:

operate said magnetic resonance data acquisition unit to acquire first phase correction data and second phase correction data, said first phase correction data having a first phase curve and said second phase correction data having a second phase curve that differs from said first phase curve;

automatically determine phase correction parameters for a phase correction of at least one of said first data and said second data, said phase correction parameters defining a difference curve of a phase difference between said second phase curve and said first phase curve, depending on correlations between data in said second phase correction data set and data in said first phase correction data set; and make said correction parameters available in electronic form at an output of said processor.

19. A non-transitory computer-readable storage medium encoded with programming instructions, said storage medium being loadable into a computerized control and processing system of a magnetic resonance system, said magnetic resonance system also comprising a magnetic resonance data acquisition unit that is adapted to interact with an examination subject, said programming instructions causing said computerized control and processing system to:

operate said magnetic resonance data acquisition unit to acquire first phase correction data and second phase correction data, said first phase correction data having a first phase curve and said second phase correction data having a second phase curve that differs from said first phase curve;

automatically determine phase correction parameters for phase correction of at least one of said first data set and said second data set, dependent on said first phase correction data set and said second phase correction data set by spatially weighting data from at least one of said first phase correction data set and data of said second phase correction data set; and automatically phase-correct at least one of said first and second data sets using said phase correction parameters.

* * * * *